United States Patent [19]
Okamura et al.

[11] Patent Number: 5,534,070
[45] Date of Patent: Jul. 9, 1996

[54] PLASMA CVD PROCESS USING A VERY-HIGH-FREQUENCY AND PLASMA CVD APPARATUS

[75] Inventors: Nobuyuki Okamura; Atsushi Yamagami, both of Kawasaki; Satoshi Takaki, Komae, all of Japan

[73] Assignee: Canon Kabushiki Kaisha, Tokyo, Japan

[21] Appl. No.: 343,560

[22] PCT Filed: Mar. 31, 1994

[86] PCT No.: PCT/JP94/00537

§ 371 Date: Nov. 30, 1994

§ 102(e) Date: Nov. 30, 1994

[30] Foreign Application Priority Data

Mar. 31, 1993 [JP] Japan .................... 5-074030

[51] Int. Cl.$^6$ .................... C23C 16/00; H05H 1/20
[52] U.S. Cl. .............. 118/723 E; 427/573; 118/723 MP; 118/730
[58] Field of Search ............ 118/723 MR, 723 E, 118/723 MA, 723 MP, 723 HC, 723 AN, 723 DC, 723 FE, 723 FI; 156/345; 204/298.37, 298.16, 298.21, 298.07; 315/111.81, 111.41, 111.31; 427/573, 588, 585

[56] References Cited

U.S. PATENT DOCUMENTS

| | | | |
|---|---|---|---|
| 4,909,183 | 3/1990 | Kamiya et al. | 118/723 E |
| 4,958,591 | 9/1990 | Yamazaki | 118/723 E |
| 5,016,565 | 5/1991 | Saitoh et al. | 118/723 MP |
| 5,129,359 | 7/1992 | Takei et al. | 118/723 MP |
| 5,433,790 | 7/1995 | Niino et al. | 118/723 MP |
| 5,439,715 | 8/1995 | Okamura et al. | 118/723 MP |

FOREIGN PATENT DOCUMENTS 60-186849 9/1985 Japan .
3064466 3/1991 Japan .

OTHER PUBLICATIONS

H. Curtins, et al., "Influence of Plasma Excitation Frequency for a Si:H Thin Film Deposition", Plasma Chemistry and Plasma Processing, vol. 7 (1987) pp. 267–273.

Primary Examiner—R. Bruce Breneman
Assistant Examiner—Joni Y. Chang
Attorney, Agent, or Firm—Fitzpatrick, Cella, Harper & Scinto

[57] ABSTRACT

A plasma CVD process comprises conducting film formation in a reaction chamber capable of being substantially vacuumed in which a plurality of cylindrical substrates are spacedly arranged on a concentric circle in said reaction chamber such that a desired discharge space is formed at the central position of the inside of said reaction chamber and a cathode electrode is disposed at the central position of said discharge space, by introducing a film-forming gas into said discharge space and applying a high frequency power from a high frequency power source to said cathode electrode to produce plasma between said plurality of cylindrical substrates and said cathode electrode, whereby forming a deposited film on the surface of each of said plurality of cylindrical substrates, characterized in that an earth shield comprising a non-magnetic material and a soft magnetic material or an insulating material being stacked is disposed at each of the opposite end portions of said cathode electrode, and a very-high-frequency energy of a frequency range of 60 MHz or more from said high frequency power source is applied to said cathode electrode to produce plasma in said reaction chamber whereby forming a deposited film on the surface of each of said plurality of cylindrical substrates. And a VHF plasma CVD apparatus suitable for practicing the plasma CVD process.

17 Claims, 12 Drawing Sheets

5,534,070

PLASMA CVD PROCESS USING A VERY-HIGH-FREQUENCY AND PLASMA CVD APPARATUS

FIELD OF THE INVENTION

The present invention relates to a plasma CVD process using a very-high-frequency which enables to form a homogeneous large area deposited film having a uniform thickness on a plurality of substrates at a high deposition rate and a plasma CVD apparatus suitable for practicing said plasma CVD process. More particularly, the present invention relates to a plasma CVD process which enables to efficiently form, on a plurality of substrates, a homogeneous large area deposited film having a uniform thickness for large area devices such as electrophotographic photosensitive members at a relatively high deposition rate, using a frequency in a frequency range which is higher than that used in the conventional RF plasma CVD process and a plasma CVD apparatus suitable for practicing said plasma CVD process.

BACKGROUND OF THE INVENTION

In recent years, the so-called RF plasma CVD process has been frequently used for the production of semiconductor devices. In the RF plasma CVD process, a high frequency of 13.56 MHz is generally used in view of the wireless telegraphy act. The RF plasma CVD process has advantages in that the discharge conditions can be relatively easily controlled and the quality of a film obtained is excellent, but it has drawbacks in that the utilization efficiency of a film-forming raw material gas is not sufficient enough and the deposition rate of a film is relatively small. In order to solve these drawbacks in the RF plasma CVD process, there has proposed a microwave plasma CVD process using a microwave with a frequency of 2.45 GHz. The microwave plasma CVD process has a pronounced advantage which cannot be attained by the RF plasma CVD process. That is, according to the microwave plasma CVD process, there can be attained the formation of a deposited film at an extremely high gas utilization efficiency and at a markedly high deposition rate. Japanese Laid-open patent application No. 186849/1985 (hereinafter referred to as Document 1) discloses an example of such microwave plasma CVD process. Particularly, in Document 1, there is described a microwave plasma CVD process using a microwave plasma CVD apparatus of the constitution shown in FIG. 1.

In the following, description will be made of the microwave plasma CVD technique described in Document 1.

In FIG. 1, reference numeral 2222 indicates a vacuum chamber (a deposition chamber). In the vacuum chamber, a plurality of rotary shafts 2238 are arranged in substantially parallel to each other. On each of the rotary shafts, a cylindrical substrate 2212 is positioned such that it can be rotated. Each cylindrical substrate 2212 can be rotated by virtue of a driving force transmitted from a motor 2250 through a driving chain 2264. In FIG. 1, there are shown only two cylindrical substrates for the simplification purpose. Actually, six cylindrical substrates 2212 are concentrically arranged such that they are spacedly positioned while maintaining a desired space between each adjacent cylindrical substrates. Reference numeral 2232 indicates an inner chamber (that is, a discharge space) which is circumscribed and formed by the six cylindrical substrates 2212. Reference numeral 2268 indicates a plasma generated in the inner chamber 2232. Reference numeral 2294 indicates a microwave transmissive window positioned at one end side of the inner chamber 2232. The microwave transmissive window is connected to a microwave power source (a magnetron) 2270 through waveguides 2282 and 2278. Reference numeral 2274 indicates an antenna probe which is extending into the waveguide 2278 from the microwave power source 2270. Reference numeral 2296 indicates another microwave transmissive window disposed at the remaining end side of the inner chamber 2232. This microwave transmissive window is connected to a a microwave power source (a magnetron) 2272 through waveguides 2284 and 2280. Reference numeral 2276 indicates an antenna probe which is extending into the waveguide 2280 from the microwave power source 2272. Microwave energy from each of the microwave power sources 2270 and 2272 is transmitted to the waveguides (2278 and 2282, or 2280 and 2284) through the antenna probe 2274 or 2276, and it is introduced into the inner chamber 2232 through the microwave transmissive window 2294 or 2296.

Film formation in the microwave plasma CVD apparatus shown in FIG. 1 is conducted as follows. That is, The vacuum chamber 2222 is evacuated through an exhaust port 2224 to bring the inside thereof to a desired vacuum. Thereafter, raw material gas is introduced into the inner chamber 2232 through gas feed pipes 2226 and 2228. Then, microwave energy is supplied into the inner chamber 2232 from the upper and lower sides of the inner chamber, wherein the raw material gas is decomposed by the action of the microwave energy to generate plasma 2268, resulting in forming a deposited film on the surface of each of the cylindrical substrates 2212 maintained at a desired temperature by means of electric heaters 2200.

Document 1 describes that according to the microwave plasma CVD apparatus shown in FIG. 1, a deposited film can be formed on each of the cylindrical substrates 2212 at a high deposition rate and at a high gas utilization efficiency. In the case of the microwave plasma CVD apparatus shown in FIG. 1, since microwave energy is used as above described, the density of the plasma generated upon the film formation becomes extremely high and because of this, the decomposition of raw material gas rapidly proceeds to cause the formation of a deposited film at an increased deposition rate. Thus, there is a problem in that it is extremely difficult to stably form a deposited film having a tense texture. In addition to this problem, there are also another problems. That is, since microwave energy is supplied into the inner chamber 2232 through the microwave transmissive windows 2294 and 2296 to cause the decomposition of raw material gas in the inner chamber, film deposition unavoidably occurs also on the microwave transmissive windows 2294 and 2296, wherein films thus deposited on these microwave transmissive windows prevent the microwave energy from efficiently transmitting through the microwave transmissive windows and in addition to this, the films deposited on the microwave transmissive windows are liable to peel off and contaminate into films deposited on the cylindrical substrates. Therefore, it is essential to periodically conduct a work of removing the films deposited on the microwave transmissive windows.

Document 1 discloses, other than the aforesaid microwave plasma CVD apparatus, a plasma CVD apparatus using a radio frequency energy (a RF energy). This plasma CVD apparatus is of the constitution shown in FIG. 2. The apparatus shown in FIG. 2 is a partial modification of the microwave plasma CVD apparatus shown in FIG. 1 in which the microwave energy introducing means is replaced by a RF energy introducing means comprising an antenna 2236. Particularly, the apparatus of FIG. 2 is constituted such that the two microwave energy introducing means of the apparatus of FIG. 1, each comprising the microwave power source, waveguides and microwave transmissive window, are removed, the installation position for one of said two microwave introducing means is sealed by a plate 2232, and an antenna is disposed at the installation position for the remaining microwave introducing means such that it extends into the inner chamber 2232. Reference numeral 2434 indicates a plate which serves to seal an opening of the upringht-standing wall 2334 which has been caused as a result of having removed the waveguide 2282. The antenna 2236 is supported by an insulating plate 2238, and it is electrically connected to a radio frequency power source (not shown) through a lead wire 2340. The antenna 2236 and the plate 2434 are designed to form a coupling means for introducing a radio frequency energy into the inner chamber 2232.

Document 1 describes that according to the apparatus shown in FIG. 2, plasma 2268 can be formed in the inner chamber 2232 by using a radio frequency energy. However, the apparatus shown in FIG. 2 has problems in that since the coupling means is constituted by the antenna 2236 and the plate 2434 and the supply of the radio frequency energy into the inner chamber 2232 is performed chiefly through the tip portion of the antenna 2336, the plasma generated in the inner chamber is liable to become uneven in the direction along the longitudinal axes of the cylindrical substrates 2212 and because of this, it is extremely difficult to form a homogeneous deposited film having a uniform thickness on each of the cylindrical substrates. This situation can be easily understood with reference to the results obtained in the experiments by the present inventors as for the process described in Document 1, which will be later described. Further, the use of a radio frequency energy is described in Document 1, but the document does not detail anything about the frequency thereof.

By the way, in recent years, studies have been made of a plasma CVD process using a very-high-frequency of the so-called VHF range, having a frequency of 30 MHz to 150 MHz which is greater than the 13.56 MHz but smaller than the microwave. For instance, in *Plasma Chemistry and Plasma Processing*, Vol. 7, No. 3, pp. 267–273 (1987) (hereinafter referred to as Document 2), there is described a film-forming manner using a glow discharge decomposition apparatus of the capacitively coupled type wherein raw material gas (silane gas) is decomposed by using a very-high-frequency energy of 25 MHz to 150 MHz to form an amorphous silicon (a-Si) film. Particularly, Document 2 describes that a-Si films are formed with a different frequency in the range of 25 MHz to 150 MHz, in the case of using a frequency of 70 MHz, the film deposition rate becomes 21 Å/sec. which is the highest, this film deposition rate is 5 to 8 times that in the RF plasma CVD process, and the defect density, optical band gap and conductivity of the resulting a-Si film is slightly influenced by the excitation frequency employed. However, Document 2 is of the film formation at a laboratory scale but it does not mention anything of whether or not the foregoing effects are provided also in the formation of a large area film. Further, Document 2 does not mention anything about a manner of efficiently forming a large area film concurrently on a plurality of substrates to produce a plurality of practically usable large area semiconductor devices. In fact, Document 2 merely suggests a possibility in the future by saying that the use of higher frequencies (13.56 MHz to 200 MHz) opens interesting perspectives for fast processing of low cost, large area a-Si:H film devices in which thicknesses of several um are required.

In addition, Japanese Laid-open patent application No. 64466/1991 (hereinafter referred to as Document 3) discloses a manner of forming an amorphous silicon series semiconductor film on a cylindrical substrate by using a very-high-frequency energy of greater than 20 MHz (preferably, 30 MHz to 50 MHz). Particularly, there is described a manner in which raw material gas is introduced into a reaction chamber, the inside of the reaction chamber is maintained at a gas pressure of $10^{-4}$ to 0.2 Torr, and a very-high-frequency energy in a quantity corresponding to 0.1 to 10 W/sccm in terms of a ratio to the flow rate of the raw material gas is introduced into the reaction chamber to cause glow discharge whereby forming said amorphous silicon series semiconductor film. Document 3 describes that according to this manner, a film deposition rate of more than 10 um/hour can be attained and the resulting deposited films can be made to be of less than 20% in thickness variation.

However in the case of the manner of Document 3, when the above film deposition rate is tried to attain by using a very-high-frequency having a frequency beyond the above mentioned frequency range, there cannot be obtained a satisfactory result. Further, Document 3 does not mention anything about a manner of efficiently forming a large area film concurrently on a plurality of substrates to produce a plurality of practically usable large area semiconductor devices.

SUMMARY OF THE INVENTION

An principal object of the present invention is to eliminate the foregoing problems in the prior art and to provide a plasma CVD process using a high frequency of the VHF range (hereinafter referred to as VHF plasma CVD process) which enables to form, on the surface of each of a plurality of cylindrical substrates, a high quality deposited film having an extremely uniform thickness and homogeneous quality in relation to not only the longitudinal axis direction but also the circumferential direction of each cylindrical substrate at a high deposition rate whereby efficiently producing a plurality of semiconductor devices.

Another object of the present invention is to provide a VHF plasma CVD process which enables to efficiently generate plasma without losses of a high frequency power applied even upon increasing the frequency of a high frequency power source.

A further object of the present invention is to provide a plasma CVD process comprising generating a plasma between a plurality of cylindrical substrates spacedly arranged on a concentric circle in a reaction chamber so as to form a space (a discharge space) in said reaction chamber and a cathode electrode disposed at the central position of said space to thereby form a deposited film on each of said plurality of cylindrical substrates, characterized in that an earth shield comprising two different material members being stacked is disposed at each of the opposite end portions of said cathode electrode, said earth shield being capable of preventing occurrence of unnecessary discharge, and a very-high-frequency of 60 MHz or above is applied to said cathode electrode to generate said plasma, whereby a high quality deposited film is formed on each of said plurality of cylindrical substrates at a high deposition rate and with a high raw material gas utilization efficiency.

A further object of the present invention is to provide a plasma CVD apparatus having a reaction chamber containing a plurality of rotatable substrate holder means spacedly arranged on a concentric circle in said reaction chamber so as to form a space (a discharge space) at the central position of said reaction chamber, each of said plurality of substrate holder means having a cylindrical substrate positioned thereon; and a cathode electrode disposed at the central position of said space; wherein a plasma is generated between said plurality of cylindrical substrates and said cathode electrode to form a deposited film on each of said plurality of cylindrical substrates, characterized in that an earth shield is disposed at each of the opposite end portions of said cathode electrode, said earth shield comprising two different material members being stacked, said earth shield being capable of preventing occurrence of unnecessary discharge, and said cathode electrode is designed such that a very-high-frequency of 60 MHz or above can be applied to said cathode electrode.

The plasma CVD process according to the present invention which attains the above objects is of the contents as will be described in the following. That is, the plasma CVD process according to the present invention comprises spacedly arranging a plurality of cylindrical substrates on a concentric circle in a reaction chamber capable of being substantially vacuumed such that a discharge space is formed at the central position of the inside of said reaction chamber, supplying a film-forming raw material gas into said discharge space, supplying a high frequency power from a high frequency power source to a cathode electrode disposed at the substantially central position of said concentric circle, to generate a plasma between said plurality of cylindrical substrates and said cathode electrode whereby causing the formation of a deposited film on each of said plurality of cylindrical substrates, characterized in that an earth shield comprising a non-magnetic member and a soft magnetic member or an insulating member being stacked is disposed at each of the opposite end portions of said cathode electrode, and a very-high-frequency energy of 60 MHz or above from said high frequency power source is applied to said cathode electrode to generate a plasma in said reaction chamber, whereby a deposited film is formed on each of said plurality of cylindrical substrates.

The present invention includes a plasma CVD apparatus suitable for practicing the above described plasma CVD process. The plasma CVD apparatus according to the present invention comprises a reaction chamber capable of being substantially vacuumed, a gas feed means for supplying a film-forming raw material gas into said reaction chamber, a plurality of rotatable substrate holder means spacedly arranged on a concentric circle in said reaction chamber so as to form a space (a discharge space) at the central position of said reaction chamber, a cathode electrode disposed at the central position of said discharge space, and a high frequency power source, wherein a plasma is generated between a plurality of cylindrical substrates each being positioned on one of said plurality of substrate holder means and said cathode electrode to form a deposited film on each of said plurality of cylindrical substrates, characterized in that an earth shield is disposed at each of the opposite end portions of said cathode electrode, said earth shield comprising a non-magnetic member and a soft magnetic member or an insulating member being stacked, said earth shield being capable of preventing occurrence of unnecessary discharge, and said cathode electrode is designed such that a very-high-frequency of 60 MHz or above from said high frequency power source can be applied to said cathode electrode.

According to the present invention, there can be efficiently and stably formed, on the surface of each of a plurality of cylindrical substrates, a high quality deposited film having an extremely uniform thickness and homogeneous quality in relation to not only the longitudinal axis direction but also the circumferential direction of each cylindrical substrate at a high deposition rate.

In the prior art, when the high frequency power used for film formation is increased with respect its frequency, losses of the high frequency energy are increased as the frequency is increased. However, in the present invention, although a very-high-frequency energy of a remarkably great frequency range is used, such energy loss is markedly small, wherein a raw material gas is efficiently decomposed to produce a desirable plasma, and as a result, desirable deposited films are formed at a high deposition rate. Hence, according to the present invention, there can be efficiently produced large area semiconductor devices.

The present inventors conducted the following experiments for the purposes of eliminating the foregoing problems in the prior art and attaining the foregoing objects of the present invention. The present invention has been accomplished based on the later described findings obtained through the experiments.

EXPERIMENT 1

This experiment was conducted based on the RF plasma CVD technique described in the foregoing Document 1 (Japanese Laid-open patent application No. 186849/1985).

That is, there were prepared a plurality of electrophotographic photosensitive members having an amorphous silicon film as a photoconductive layer, using a high frequency power source capable of providing various frequencies. As for the film formation in the preparation of each electrophotographic photosensitive member, observation was made of the situation for the frequency of the high frequency power source to impart an influence not only to a deposited film formed in terms of film thickness and also to the deposition rate of said deposited film. In addition, each of the resultant electrophotographic photosensitive members was evaluated.

Figure 1:
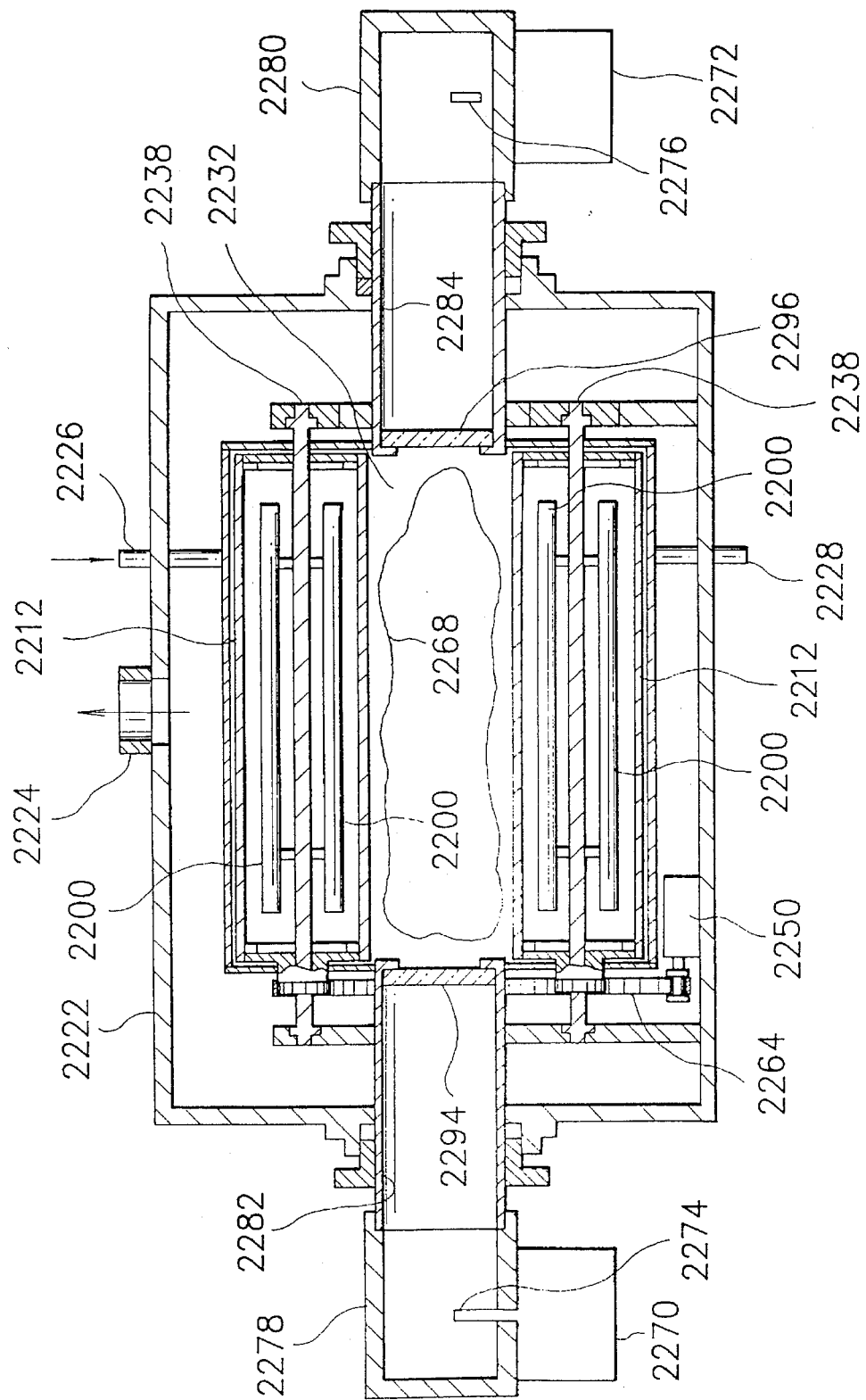
FIG. 1 is a schematic diagram of a conventional plasma CVD apparatus.
Figure 2:
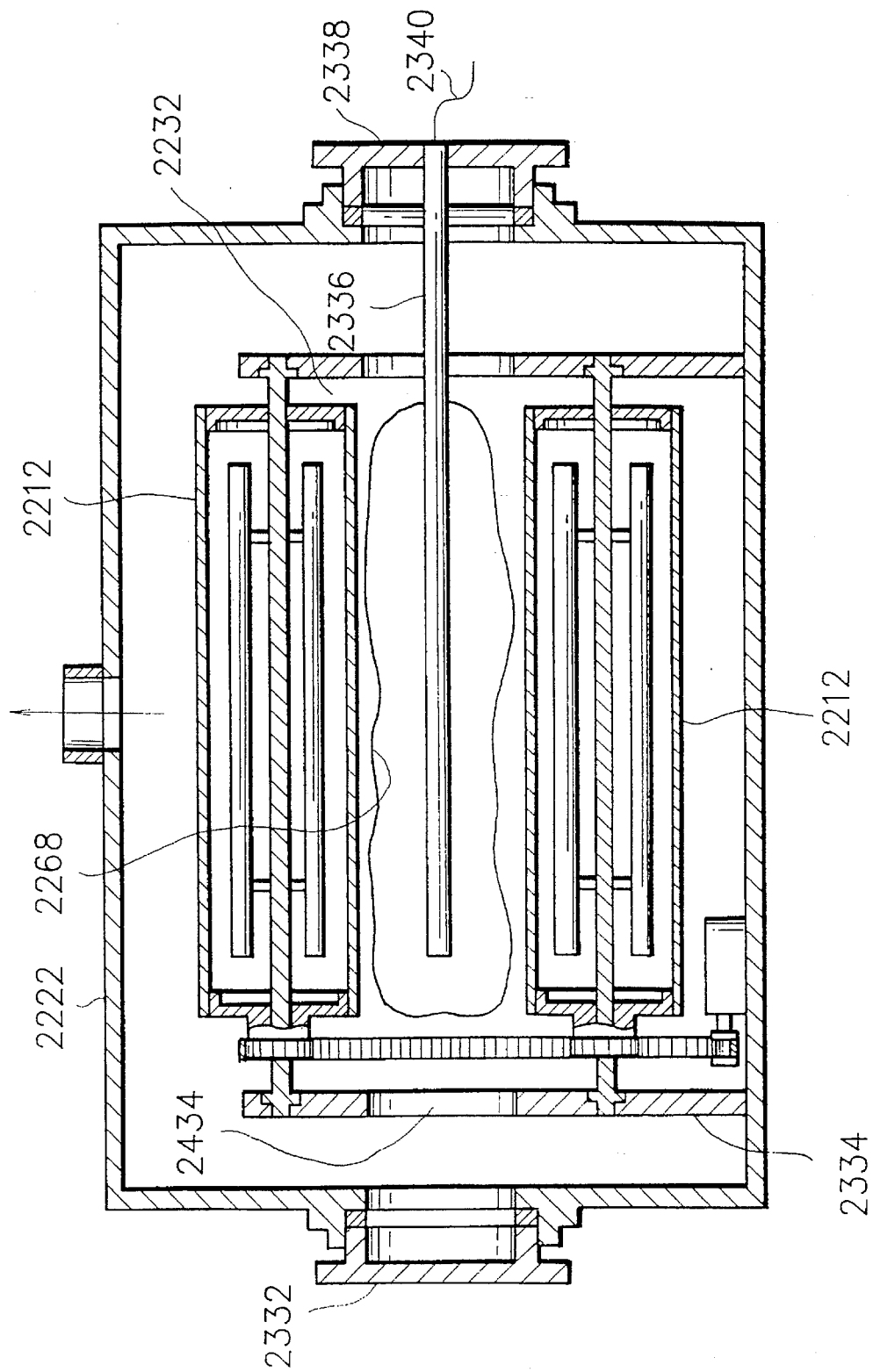
FIG. 2 is a schematic diagram of another conventional plasma CVD apparatus.
Figure 3:
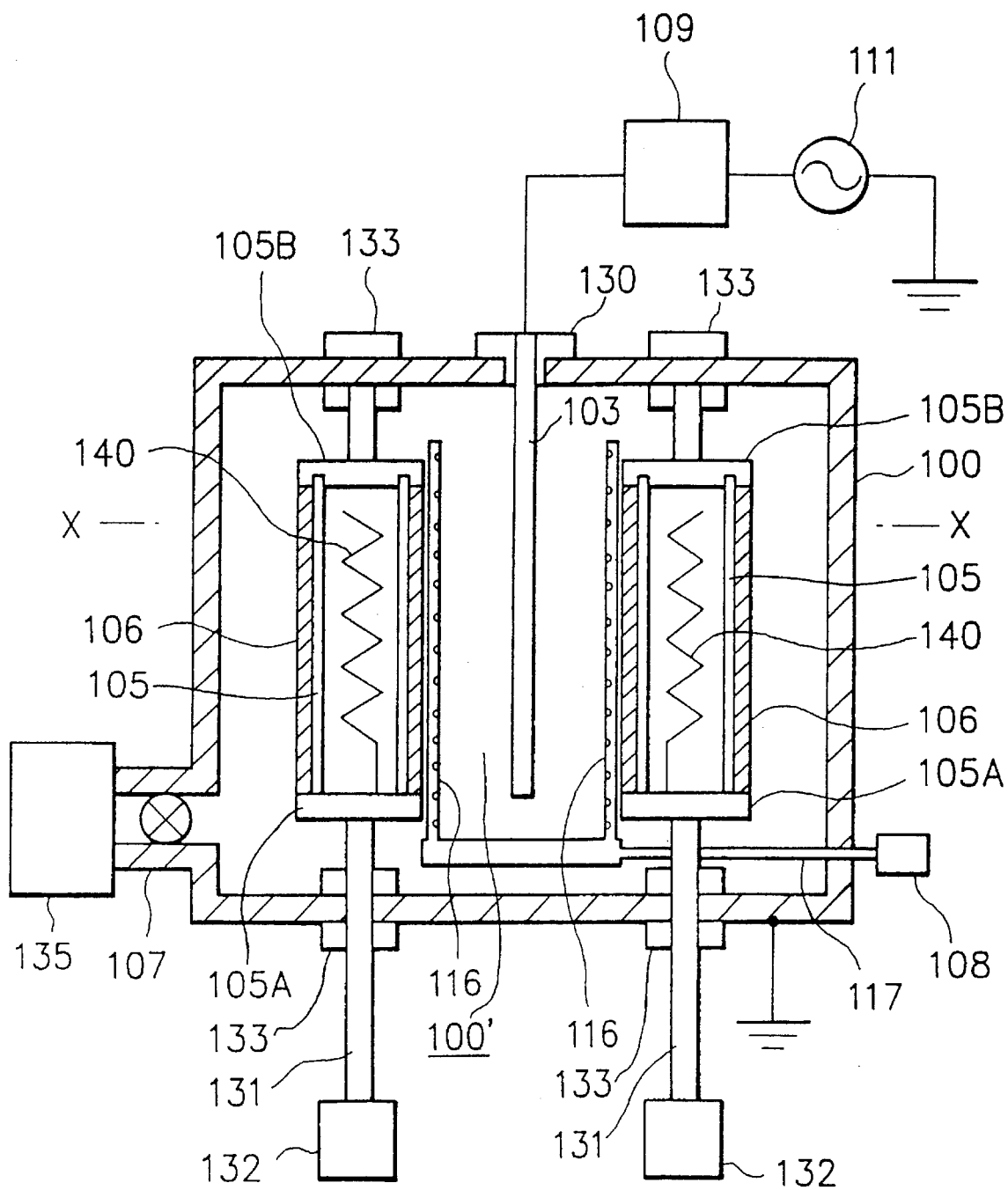
FIG. 3 is a schematic diagram of a plasma CVD apparatus comprising the plasma CVD apparatus shown in FIG. 2 having been modified for experimental purposes.
Figure 4:
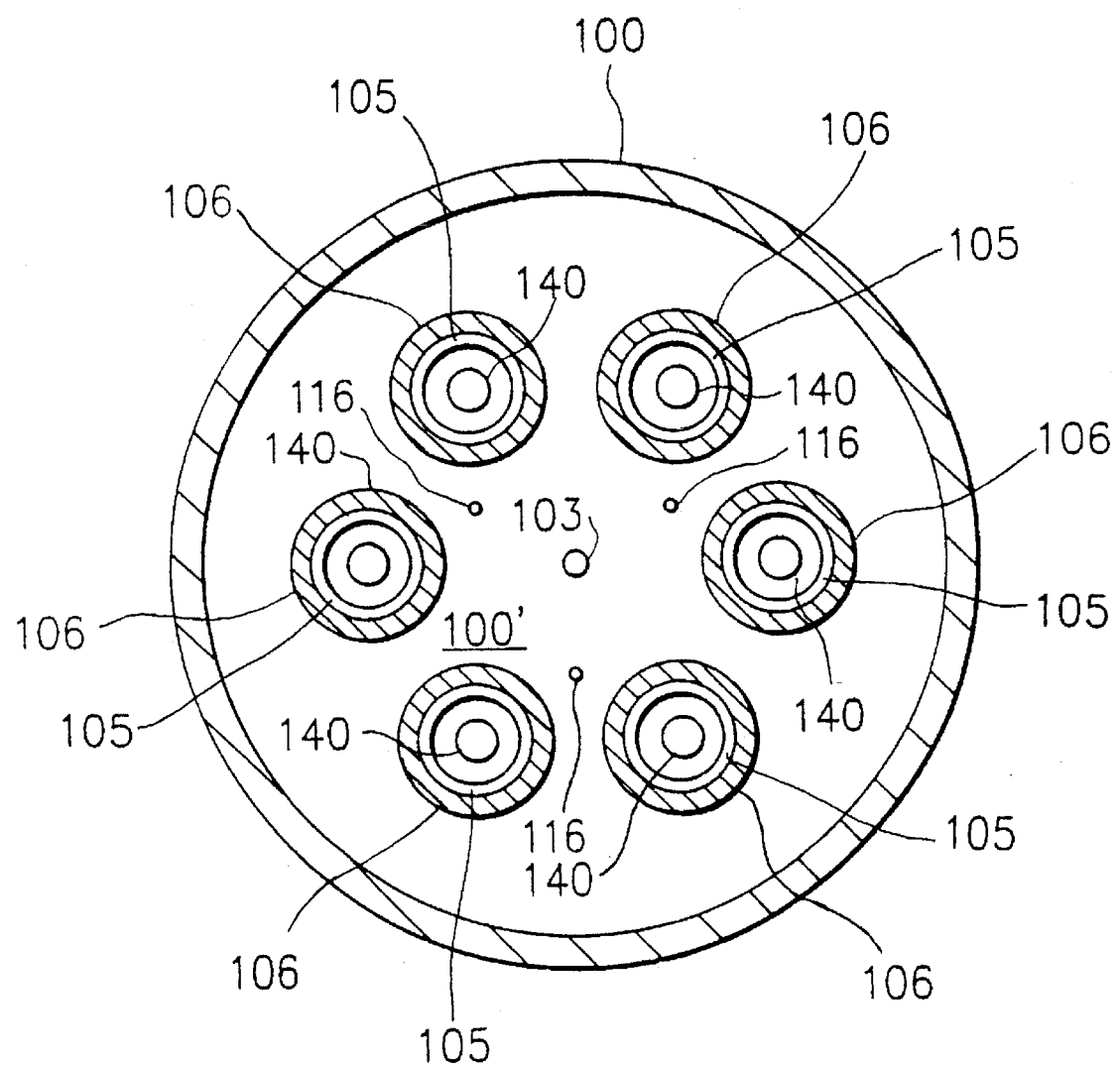
FIG. 4 is a schematic cross-sectional view taken along the X—X line in the plasma CVD apparatus shown in FIG. 3.

Each electrophotographic photosensitive member was prepared using a plasma CVD apparatus shown in FIGS. 3 and 4, which is based on the RF plasma CVD apparatus shown in FIG. 2. FIG. 4 is a schematic cross-sectional view taken along the X—X line in FIG. 3.

FIGS. 3 and 4, reference numeral 100 indicates a reaction chamber. In the reaction chamber 100, six substrate holders 105 are spacedly and concentrically arranged while maintaining a desired space between each adjacent substrate holders. Reference numeral 106 indicates a cylindrical substrate for film formation which is positioned on each substrate holder 105. Each substrate holder 105 is provided with an electric heater 140 installed in the inside thereof such that it can heat the cylindrical substrate 106 from the back of the substrate. Each substrate holder 105 is connected to a rotary shaft 131 connected to a motor 132 so that the substrate holder can be rotated. Each of reference numerals 105A and 105B indicates an auxiliary support member for the cylindrical substrate. Reference numeral 103 indicates an antenna for applying a high frequency power which is positioned at the center of a plasma generation region of the reaction chamber. The antenna 103 is connected to a high frequency power source 111 through a coaxial stub tuner 109. Reference numeral 130 indicates a support member for the antenna. Reference numeral 107 indicates an exhaust pipe provided with an exhaust valve. The exhaust pipe is connected to an exhausting mechanism 135 provided with a vacuum pump. Reference numeral 108 indicates a raw material gas supply system having gas reservoirs, mass flow controllers and valves. The raw material gas supply system 108 is connected to gas liberation pipes 116 each having a plurality of gas liberation holes through a gas supply pipe 117. Reference numeral 133 indicates a sealing member.

In this experiment, there were conducted a plurality of runs. In each run, six aluminum cylindrical substrates of 108 mm in outer diameter, 358 mm in length and 5 mm in thickness were positioned in the reaction chamber 100. That is, in each run, using the plasma CVD apparatus shown in FIGS. 3 and 4, there were formed a charge injection inhibition layer, a photoconductive layer and a surface protective layer in the named order on each aluminum cylindrical substrate under the conditions shown in Tables 1 and 2, to thereby obtain electrophotographic photosensitive members. In this manner, using a high frequency power of a different frequency shown in Table 2 in each run, there were obtained electrophotographic photosensitive members of 10 batches (Sample Nos. 1, 2, 3, 4, 5, 6, 7, 8, 9, and 10).

The film formation in each run was conducted in the following manner. That is, six aluminum cylindrical substrates 106 were positioned respectively on the corresponding substrate holder 105 of the reaction chamber 100. Thereafter, the reaction chamber 100 was evacuated by operating the exhaust mechanism 135 to bring the inside of the reaction chamber to a vacuum of $1 \times 10^{-6}$ Torr. Then, the electric heaters 140 were energized to heat the cylindrical substrates 106 to 250° C., and they were maintained at this temperature. Successively, a charge injection inhibition layer was formed on each cylindrical substrate under the conditions shown in the column of charge injection inhibition layer of Table 1. That is, from the gas supply system 108 and through the gas supply pipe 117 and the gas liberation pipes 116, $SiH_4$ gas, $H_2$ gas, NO gas, and $B_2H_6$ gas were fed into the reaction chamber 100 at respective flow rates of 500 sccm, 10 sccm, 10 sccm, and 2000 ppm. The inside of the reaction chamber was then controlled to a gas pressure of 50 mTorr. Then, the high frequency power source 111 was switched on to supply a high frequency having a different frequency in the range of 13.56 MHz to 350 MHz shown in Table 2 to the antenna 103 through the coaxial cable and coaxial stub tuner 109. As the high frequency power source 111 herein, there was used a high frequency power source capable of providing a desired frequency in the above described range. The coaxial stub tuner 109 was properly adjusted in accordance with the frequency of the high frequency power source. Thus, in the discharge space 100' circumscribed by the six cylindrical substrates 106 and having the antenna 103 therein, the foregoing raw material gases were excited and decomposed by the action of the high frequency energy to cause the formation of an about 1 μm thick amorphous silicon film (that is, an a-Si:H:N:O:B film) as the charge injection inhibition layer on the surface of each of the six cylindrical substrates 106. In the same manner, there were formed an about 25 μm thick a-Si:H film as the photoconductive layer under the conditions shown in the column of photoconductive layer of Table 1, and then, an about 1 μm thick a-SiC:H film as the surface protective layer under the conditions shown in the column of surface protective layer of Table 1, whereby six electrophotographic photosensitive members were prepared. In this way, there were obtained Samples Nos. 1 to 10 each comprising six electrophotographic photosensitive members. The film formation in the preparation of each sample was conducted with the use of the corresponding different frequency shown in Table 2. Further, in the film formation in the preparation of each sample, the cylindrical substrates were rotated by operating the motor 132.

In the film formation in the preparation of each of Samples Nos. 1 to 9, the plasma luminescence was found to be the strongest in the vicinity of the antenna support member 130 by way of optical observation. In the preparation of Sample No. 10, discharge intermittently occurred and because of this, desirable film formation was not performed.

As for each of Samples Nos. 1 to 9, evaluation was made of the film thickness distribution state by a manner of measuring the thickness of the film on one randomly selected from the six cylindrical substrates 106 at 100 intersections between apparent lines formed on said cylindrical substrate at an equal interval of 33 mm in the longitudinal axis direction and lines formed on said cylindrical substrate at an equal interval in the circumferential direction by means of an eddy current film thickness measuring instrument (produced by Kett Science Laboratory Company). Particularly, the evaluation of the film thickness distribution state was conducted in the following manner. That is, as for the evaluation of the film thickness distribution state in the long axis direction, there were obtained a difference between the maximum value and the minimum value among the ten film thicknesses at the ten intersections in a given longitudinal axis row and a mean value among the ten film thicknesses, and said difference was divided by said means value, to thereby obtain a film thickness distribution (the maximum film thickness value–the minimum film thickness value/the mean value) for said one row. As for each of other nine longitudinal axis rows, there was obtained a film thickness distribution in the same manner as in the above. Then, there was obtained a mean value among the ten film thickness distributions obtained. The resultant value was considered to be a film thickness distribution (that is, a film thickness variation) in the longitudinal axis direction. The results obtained are collectively shown in in Table 3, wherein the values indicted are in percentage.

In the case where the value of the film thickness distribution was more than 20%, evaluation of the deposition rate was not conducted. In the case where the value of the film thickness distribution was less than 20%, there was obtained a mean value among the film thicknesses at the above 100 positions, and the mean value obtained was considered to be a deposition rate. The results obtained are collectively shown in Table 3.

In addition, as for each of Samples Nos. 1 to 9, one randomly selected from the six electrophotographic photosensitive members was subjected to evaluation with respect to charge retentivity and quality of an image obtained by using an electrophotographic copying machine (a modification of NP 6060 produced by Canon Kabushiki Kaisha for experimental purposes). The evaluated results obtained are collectively shown in Table 3.

The evaluation of each evaluation item in the above was conducted in the following manner.
Evaluation of charge retentivity:

Each sample was set to the electrophotographic copying machine, wherein corona charging was conducted by applying a voltage of +6 kV to the charging device and the surface potential in dark was measured by means of a surface potentiometer. The measurement in this case was conducted at each of the same 100 positions as employed in the above evaluation of the film thickness distribution. There was obtained a mean value among the measured results. The value being the most distant from the mean value was subjected to evaluation based on the following evaluation criteria.

⊚: the case wherein the value is less than 10 V and thus, it is excellent in uniformity;
○: the case wherein the value is less than 20 V and thus, it is good in uniformity;
Δ: the case wherein the value is less than 30 V and it is considered to be not problematic in practice; and
X: the case wherein the value is beyond 30 V and thus, it is apparently inferior in uniformity, and it is considered to be insufficient for use in a high speed copying machine.
Evaluation of image:

A whole halftone original (that is, a halftone test chart FY9-9042 produced by Canon Kabushiki Kaisha) was positioned on the original table of the electrophotographic copying machine, wherein as for each sample, image formation was conducted to obtain a copied image sample. the resultant copied image sample was evaluated on the basis of the following evaluation criteria.

⊚: the case wherein the copied image is free of unevenness in density and it is excellent in quality;
○: the case wherein the the copied image is accompanied by a slight density unevenness but it is good enough in quality;
Δ: the case wherein the copied image is accompanied by somewhat density unevennesses on the entire area but it is practically acceptable; and
X: the case wherein the copied image is accompanied by remarkable density unevennesses on the entire area and thus, it is practically unacceptable.

Based on the results obtained in the above, there were obtained the following findings. That is, (i) in the case where film formation is conducted by applying a high frequency power into the reaction chamber through the antenna, discharge in the vicinity of the position through which the high frequency power is applied unavoidably becomes intense even by empoying any frequency range and wherein a film thickness variation of more than 30% is occurred for a deposited film on a cylindrical substrate in relation to the longitudinal axis direction of the cylindrical substrate; (ii) as the frequency used is increased, the film thickness variation for a deposited film formed on a cylindrical substrate in relation to the longitudinal axis direction of the cylindrical substrate is increased accordingly; and (iii) by the manner of applying a high frequency power into the reaction chamber through an antenna, it is extremely difficult to produce a practically usable electrophotographic photosensitive member excelling in charge retentivity and capable of providing a high quality copied image excelling in image density.

EXPERIMENT 2

In view of the findings obtained in Experiment 1 in that in the manner of applying a high frequency power in the reaction chamber through the antenna, it is extremely difficult to cause uniform discharge between the antenna and the cylindrical substrates and because of this, it is extremely difficult to form a deposited film having a homogeneous film quality and a uniform thickness on the surface of each cylindrical substrate, in this experiment, using a plasma CVD apparatus in which a cathode electrode is disposed instead of the antenna, a plurality of electrophotographic photosensitive members were prepared as well as in Experiment 1, and observation was conducted of influences of various frequencies of the high frequency power source to the thickness variations and deposition rates of deposited films obtained.

Figure 5:
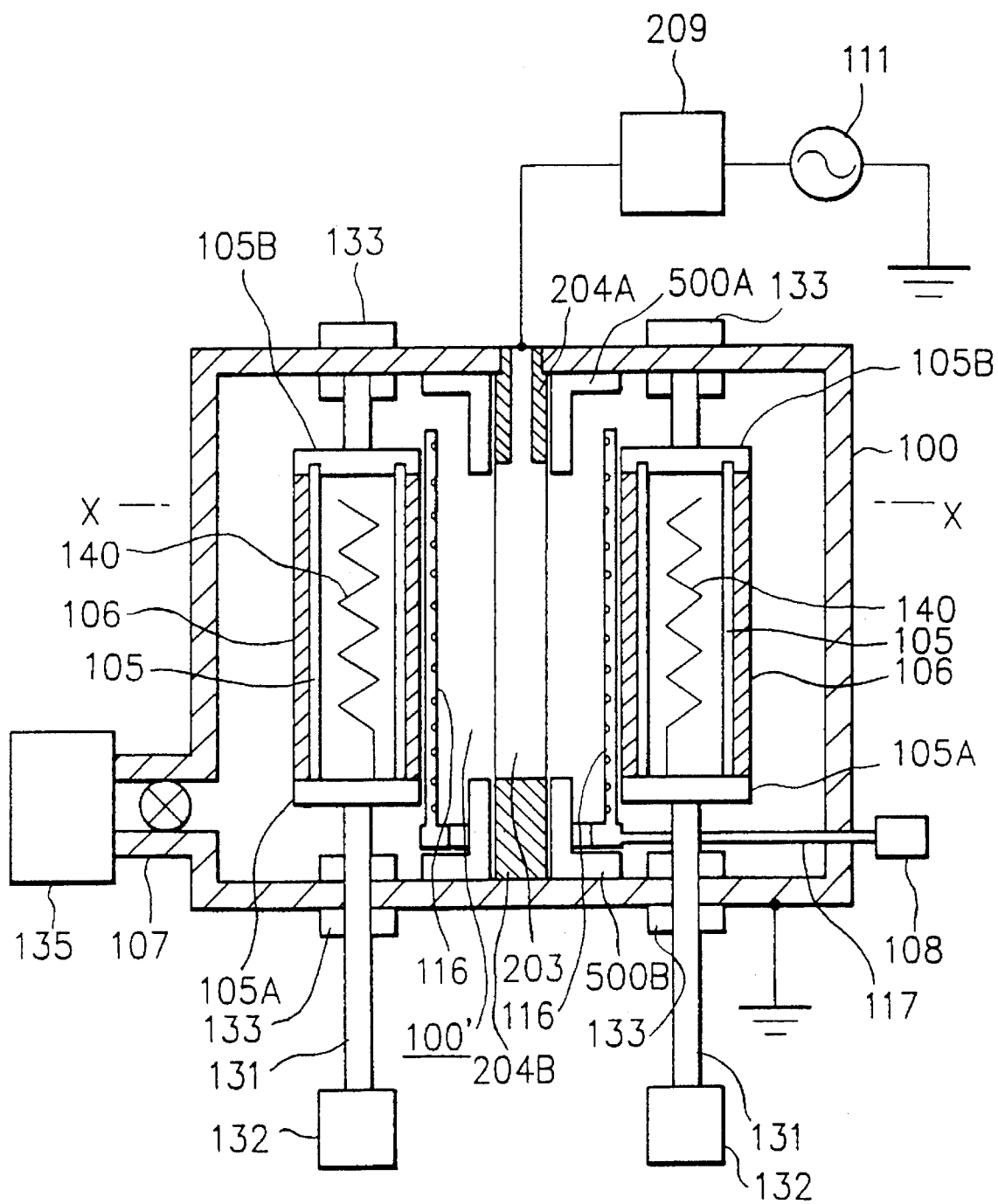
FIG. 5 is a schematic diagram of a plasma CVD apparatus used in the experiments conducted by the present inventors in order to obtain a plasma CVD apparatus according to the present invention.
Figure 6:
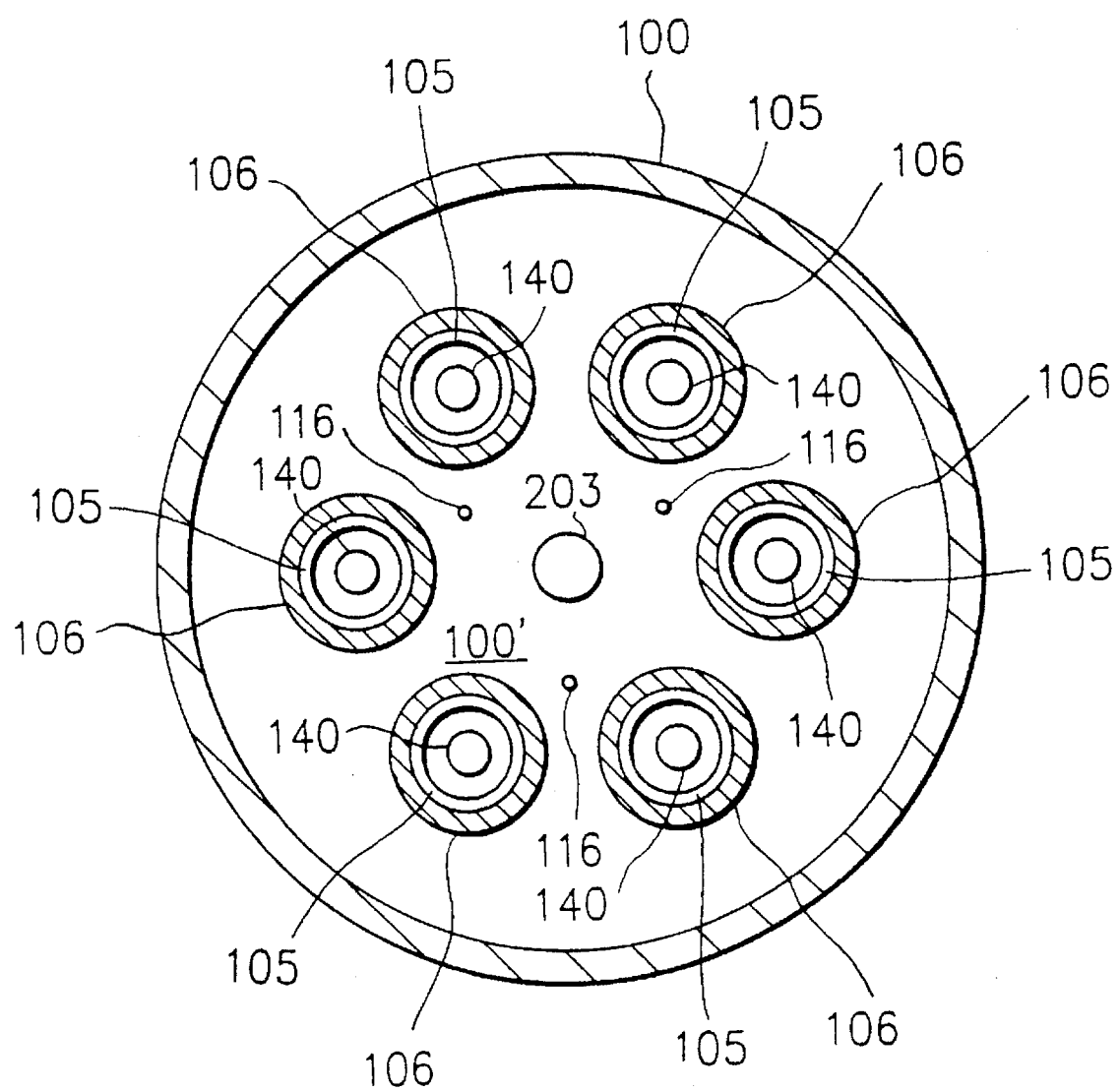
FIG. 6 is a schematic cross-sectional view taken along the X—X line in the plasma CVD apparatus shown in FIG. 5.

In this experiment, there was used a plasma CVD apparatus of the constitution shown in FIG. 5. FIG. 6 is a schematic cross-sectional view taken along the X—X line in FIG. 5. The plasma CVD apparatus shown in FIGS. 5 and 6 is of the same constitution as that of the plasma CVD apparatus shown in FIGS. 3 and 4, except that a cathode electrode 203 is disposed instead of the antenna 103 in the apparatus shown in FIG. 3, the cathode electrode 203 is electrically isolated from the reaction chamber by means of insulating members 204A and 204B, earth shields 500A and 500B capable of serving to prevent occurrence of unnecessary discharge are respectively disposed around each of the insulating members 204A and 204B, and a matching circuit 209 having an LC circuit is disposed instead of the stub tuner 109 in the apparatus shown in FIG. 3.

In this experiment, there were conducted a plurality of runs under the film forming conditions shown in Table 1 and respective frequency conditions shown in Table 4 and wherein the gas pressure in the inside of the reaction chamber upon film formation was made constant at 50 mTorr. There were obtained Samples Nos. 11 to 20 each comprising six electrophotographic photosensitive members. In each run, as the six cylindrical substrates 106, there were used six aluminum cylindrical substrates of 108 mm in outer diameter, 358 mm in length and 5 mm in thickness, and on the surface of each aluminum cylindrical substrate, there were formed a charge injection inhibition layer, a photoconductive layer and a surface protective layer in the named order.

As the cathode electrode 203, there was used a cylinder made of aluminum having a size of 70 mm in outer diameter, 400 mm in length and 5 mm in thickness.

Each sample was prepared in the following manner. That is, six aluminum cylindrical substrates 106 were positioned respectively on the corresponding substrate holder 105 of the reaction chamber 100. Thereafter, the reaction chamber 100 was evacuated by operating the exhaust mechanism 135 to bring the inside of the reaction chamber to a vacuum of 1×10$^{-6}$ Torr. Then, the electric heaters 140 were energized to heat the cylindrical substrates 106 to 250° C., and they were maintained at this temperature. Successively, a charge injection inhibition layer was formed on each cylindrical substrate under the conditions shown in the column of charge injection inhibition layer of Table 1. That is, from the gas supply system 108 and through the gas supply pipe 117 and the gas liberation pipes 116, SiH$_4$ gas, H$_2$ gas, NO gas, and B$_2$H$_6$ gas were fed into the reaction chamber 100 at respective flow rates of 500 sccm, 10 sccm, 10 sccm, and 2000 ppm. The inside of the reaction chamber was then controlled to a gas pressure of 50 mTorr. Then, the high frequency power source 111 was switched on to supply a high frequency having a different frequency in the range of 13.56 MHz to 350 MHz shown in Table 4 to the cathode electrode 203 through the matching circuit 209. As the high frequency power source 111 herein, there was used a high frequency power source capable of providing a desired frequency in the above described range. The matching circuit 209 was properly adjusted in accordance with the frequency of the high frequency power source. Thus, in the discharge space 100' circumscribed by the six cylindrical substrates 106 and the cathode electrode 203, the foregoing raw material gases were excited and decomposed by the action of the high frequency energy to cause the formation of an about 1 μm thick amorphous silicon film (that is, an a-Si:H:N:O:B film) as the charge injection inhibition layer on the surface of each of the six cylindrical substrates 106. In the same manner, there were formed an about 25 μm thick a-Si:H film as the photoconductive layer under the conditions shown in the column of photoconductive layer of Table 1, and then, an about 1 μm thick a-SiC:H film as the surface protective layer under the conditions shown in the column of surface protective layer of Table 1, whereby six electrophotographic photosensitive members were prepared. In this way, there were obtained Samples Nos. 11 to 20 each comprising six electrophotographic photosensitive members. The film formation in the preparation of each sample was conducted with the use of the corresponding different frequency shown in Table 4. Further, in the film formation in the preparation of each sample, the cylindrical substrates were rotated by operating the motor 132.

In the film formation of each run, optical observation was made of the situation of plasma luminescence. In the film formation in the preparation of each of Samples Nos. 11 to 13, plasma luminescence was relatively stably occurred in relation to the longitudinal axis directions of the cylindrical substrates. However, in the film formation in the preparation of each of Samples 14 to 20, strong plasma luminescence was observed in the vicinity of the the earth shield 500A. And the magnitude of such plasma luminescence was found to become remarkable as the frequency is increased. Each of the resultant samples was subjected to evaluation in the same manner as in Experiment 1. The evaluated results obtained are collectively shown in Table 4.

Based on the results shown in Table 4, there were obtained the following findings. That is, (i) even in the case where film formation is conducted by applying a high frequency power into the reaction chamber through the cathode electrode instead of the antenna, there is a tendency for a deposited film formed on each of the cylindrical substrates to be increased in terms of the thickness variation in relation to the longitudinal axis direction of the cylindrical substrate as the frequency used is increased; (ii) in the film formation using a frequency in the range of 13.56 MHz to 50 MHz, the deposition rate of a deposited film formed is increased as the frequency is increased within said frequency range; and (iii) as apparent from the results in the case of each of Samples Nos. 11 to 13, when the film formation is conducted using a high frequency power having a relatively lower frequency, there can obtained practically usable electrophotographic photosensitive members in view of charge retentivity and the quality of a copied image in terms of density, but as apparent from the results in other cases, when the film formation is conducted using a high frequency power having a frequency of more than 60 MHz, there cannot be obtained any practically usable electrophotographic photosensitive members which satisfy the image-forming characteristics desired therefor.

EXPERIMENT 3

In view of the findings obtained in Experiment 2, experimental studies were made of the cause in that in the case where film formation is conducted using a high frequency power having a frequency of more than 60 MHz, there is a tendency for the deposited film formed to be increased in terms of thickness variation in the longitudinal direction. As a result of the discussions for this cause, the present inventors presumed that there would be a certain interrelation between the occurrence of such film thickness variation and the density of plasma generated upon the film formation. In this experiment, based on this presumption, the density of plasma generated in the plasma generation space between the cylindrical substrates and the cathode electrode 203 was measured at various positions in the plasma generation space.

Figure 7:
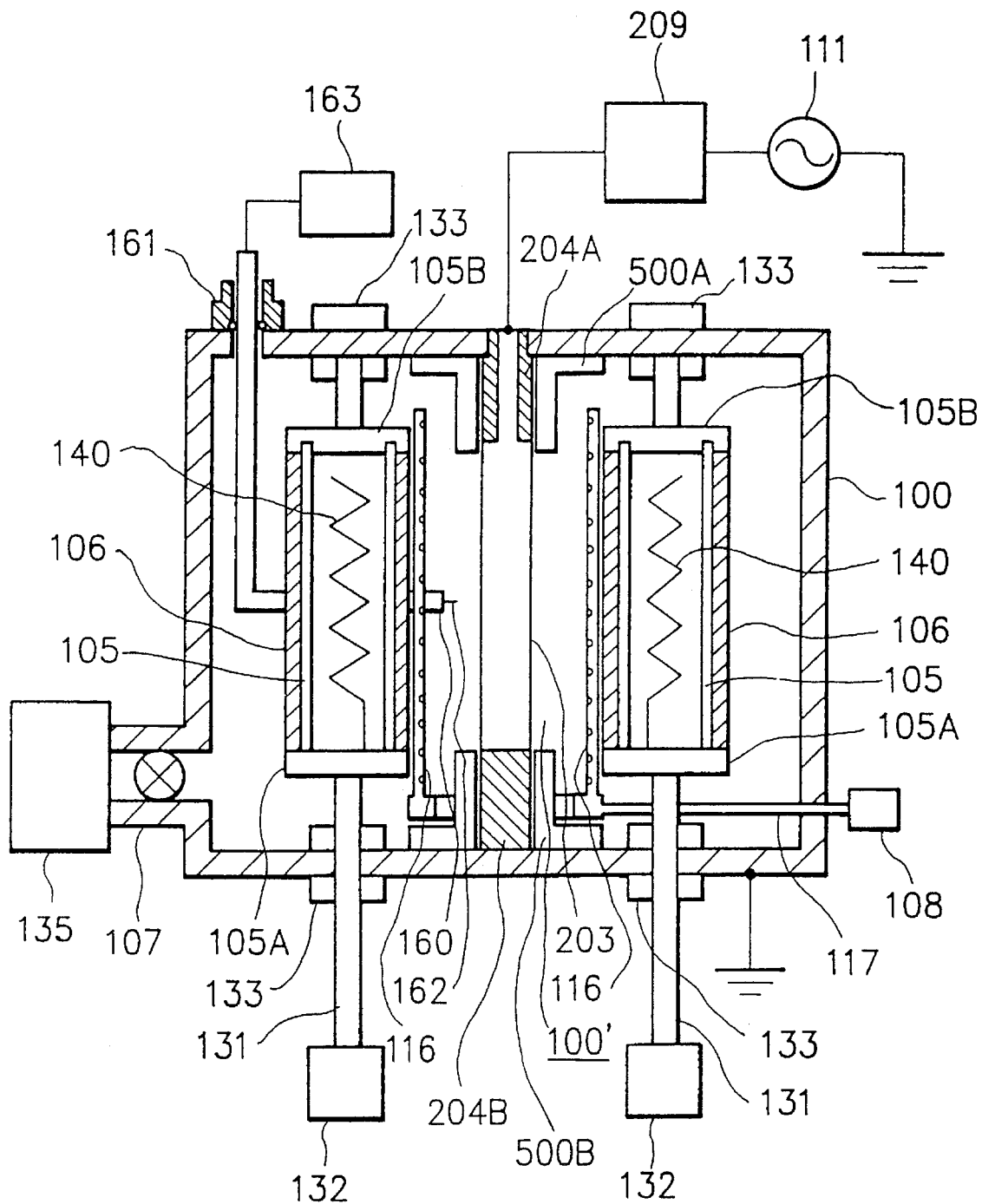
FIG. 7 is a schematic diagram of another plasma CVD apparatus used in the experiments conducted by the present inventors in order to obtain a plasma CVD apparatus according to the present invention.

In this experiment, there was used a plasma CVD apparatus shown in FIG. 7 corresponding to a partial modification of the plasma CVD apparatus shown in FIGS. 5 and 6 in which a probe for measuring the density of plasma is disposed.

In FIG. 7, reference numeral indicates a probe fixed to a support arm 160. The probe is electrically connected to a plasma density measuring mechanism 163 through the support arm 160. The support arm 160 is penetrated the upper wall of the reaction chamber, and it is designed such that the probe 162 can move up and down along the cathode electrode 203 in the plasma generation space 100'. Reference numeral 161 indicates a seal flange. The seal flange 161 is disposed such that it hermetically seals between the support arm 160 and the upper wall of the reaction chamber 100 and it permits the support arm 160 to move up and down.

The density of plasma generated in the discharge space 100', namely, plasma density (electron density Ne), can be obtained by a manner of obtaining a thermal diffusion electron current Ieo and an electron temperature Te by the single probe method and applying these factors to the following equation.

$$Ne = 3.73 \times 10^{11} \times Ieo \div S \div Te^{1/2}$$

(wherein S is a surface area of the probe)

In this experiment, studies were made of the interrelation between the frequency of a high frequency power used and the density of plasma generated using a high frequency power source of 40 MHz to 100 MHz in frequency. Particularly, only the formation of a photoconductive layer was conducted not only under the photoconductive layer-forming conditions employed in the preparation of Sample 12 (the frequency: 40 MHz) but also under the photoconductive layer-forming conditions employed in the preparation of Sample 15 (the frequency: 100 MHz) respectively in Experiment 2. In each case, during the formation of the photoconductive layer, the probe was moved up and down to measure the density of plasma generated in the discharge space 100' circumscribed by the cylindrical substrates 106 and the cathode electrode 203. The resultants interrelations between the positions of the probe 162 and the densities of the plasmas, which were obtained in respective cases, are graphically shown in FIG. 8 (the frequency: 40 MHz) and in FIG. 9 (the frequency: 100 MHz). In each of FIGS. 8 and 9, the position corresponding to a ½ height of the cylindrical substrate was made to be a zero level, the position situated above the zero level was made to be plus, and the position situated under the the zero level was made to be minus.

Figure 8:
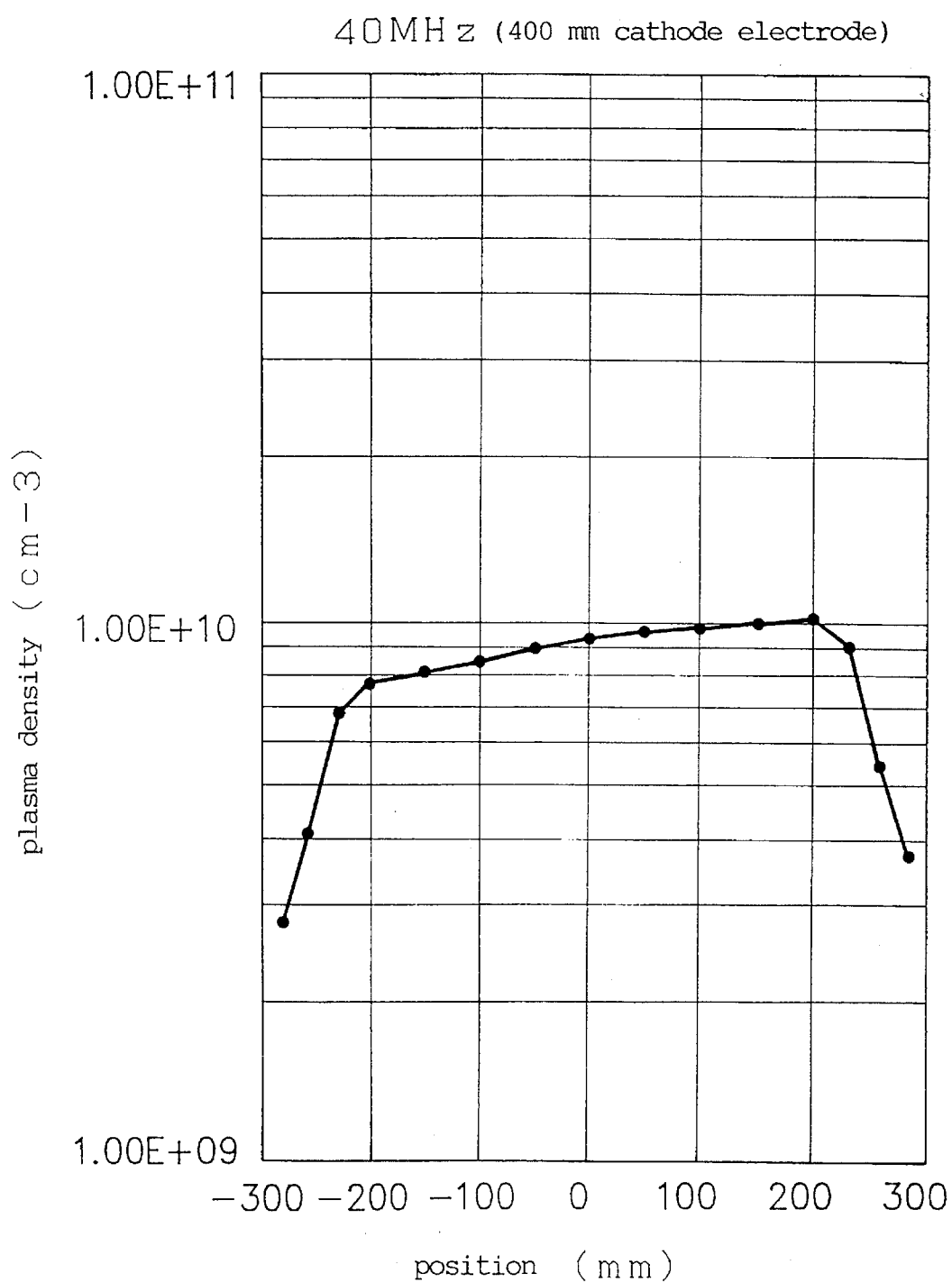
FIG. 8 is a graph of experimental results in which the plasma densities in the plasma CVD apparatus are plotted in relation to the respective positions of the cylindrical substrates.
Figure 9:
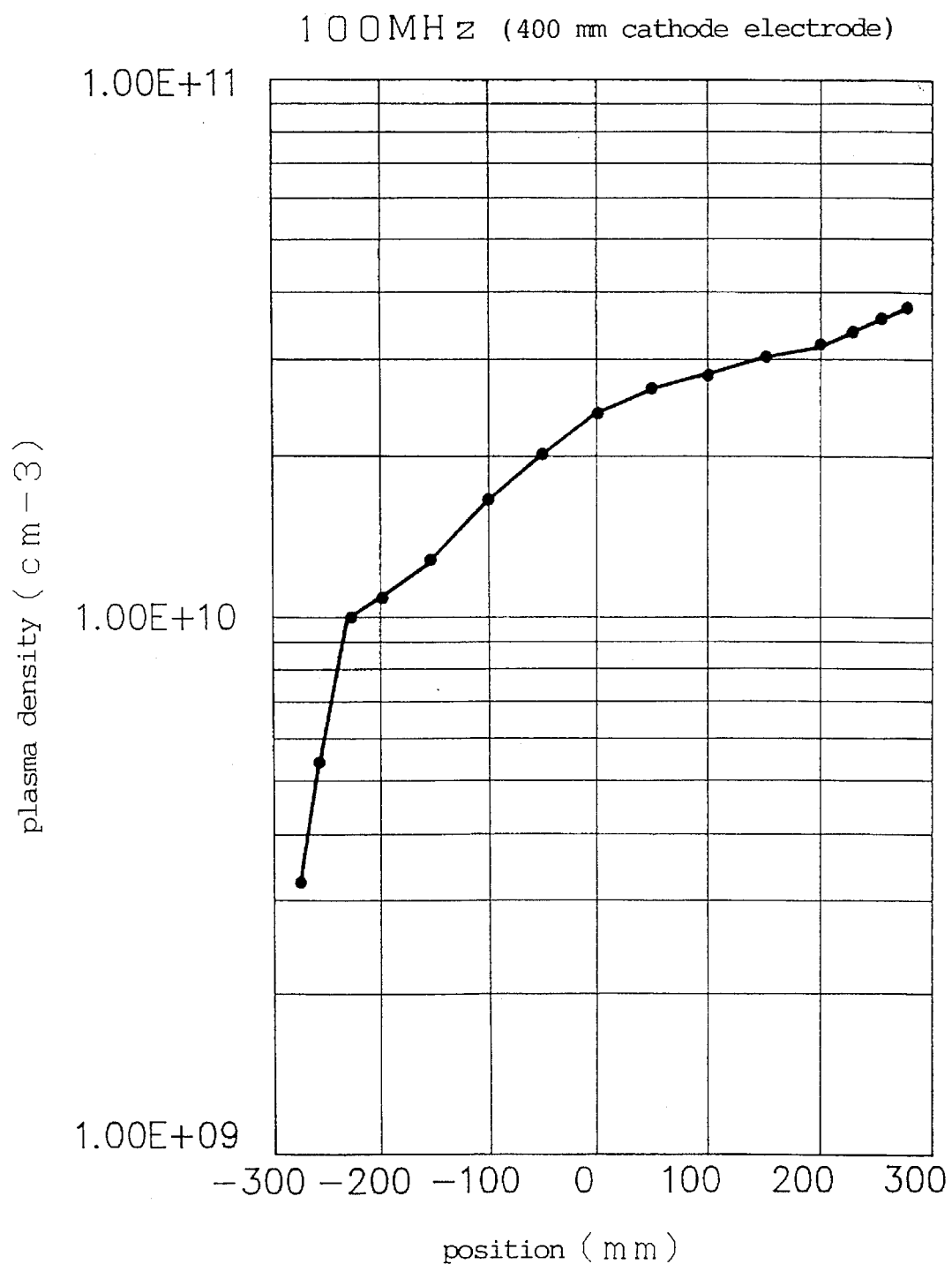
FIG. 9 is a graph of another experimental results in which the plasma densities in the plasma CVD apparatus are plotted in relation to the respective positions of the cylindrical substrates.

As apparent from the results shown in FIG. 8, in the case of using the high frequency power source of 40 MHz in frequency, there is a tendency that the density of plasma generated in the vicinity of each of the earth shields 500A and 500B becomes apparently lower and that in the 358 mm long region where the cylindrical substrates are situated, the density of plasma generated in the region corresponding to the upper side of the cathode electrode, namely, in the region on the side where the high frequency power is supplied, becomes greater than the density of plasma generated in the region on the lower side of the cathode electrode. On the other hand, as apparent from the results shown in FIG. 9, in the case of using the high frequency power source of 100 MHz in frequency, there is a tendency that the density of plasma generated in the region corresponding to the upper side of the cathode electrode, namely, in the region on the side where the high frequency power is supplied, becomes markedly greater than the density of plasma generated in the region on the lower side of the cathode electrode and that the density of plasma generated in the vicinity of the earth shield 500A becomes maximum. In fact, there was found markedly strong plasma luminescence in the vicinity of the earth shield 500A by way of the optical observation.

As for the above silicon films formed on the cylindrical substrates using the high frequency power of 40 MHz in frequency and also as for the above silicon films formed on the cylindrical substrates using the high frequency power of 100 MHz in frequency, their film thickness distribution was examined in the same manner as in Experiment 1. As a result, each of the former silicon films was found to have a thickness distribution depending on the plasma density shown in FIG. 8 wherein the thickness is gradually thickened from the lower side towards the upper side of the cylindrical substrate. And each of the latter silicon film was found to have a thickness distribution depending on the plasma density shown in FIG. 9 wherein the thickness on the upper side of the cylindrical substrate is markedly thicker than that on the lower side of the cylindrical substrate.

DISCUSSION

The present inventors made studies of the interrelations between the frequency and plasma density obtained in Experiment 3 in other viewpoints. That is, in this experiment, there was presumed an equivalent circuit by substituting the electrode and plasma, which consume the high frequency power, by a resistance coil, namely an inductance, and a condenser, that is, a capacitance.

The present inventors thought that in accordance with this equivalent circuit, it would be possible to clear up the cause of varying the density of plasma generated with the use of a high frequency power having a higher frequency than that of the high frequency power used in the prior art in relation to propagation of the high frequency power.

Figure 10:
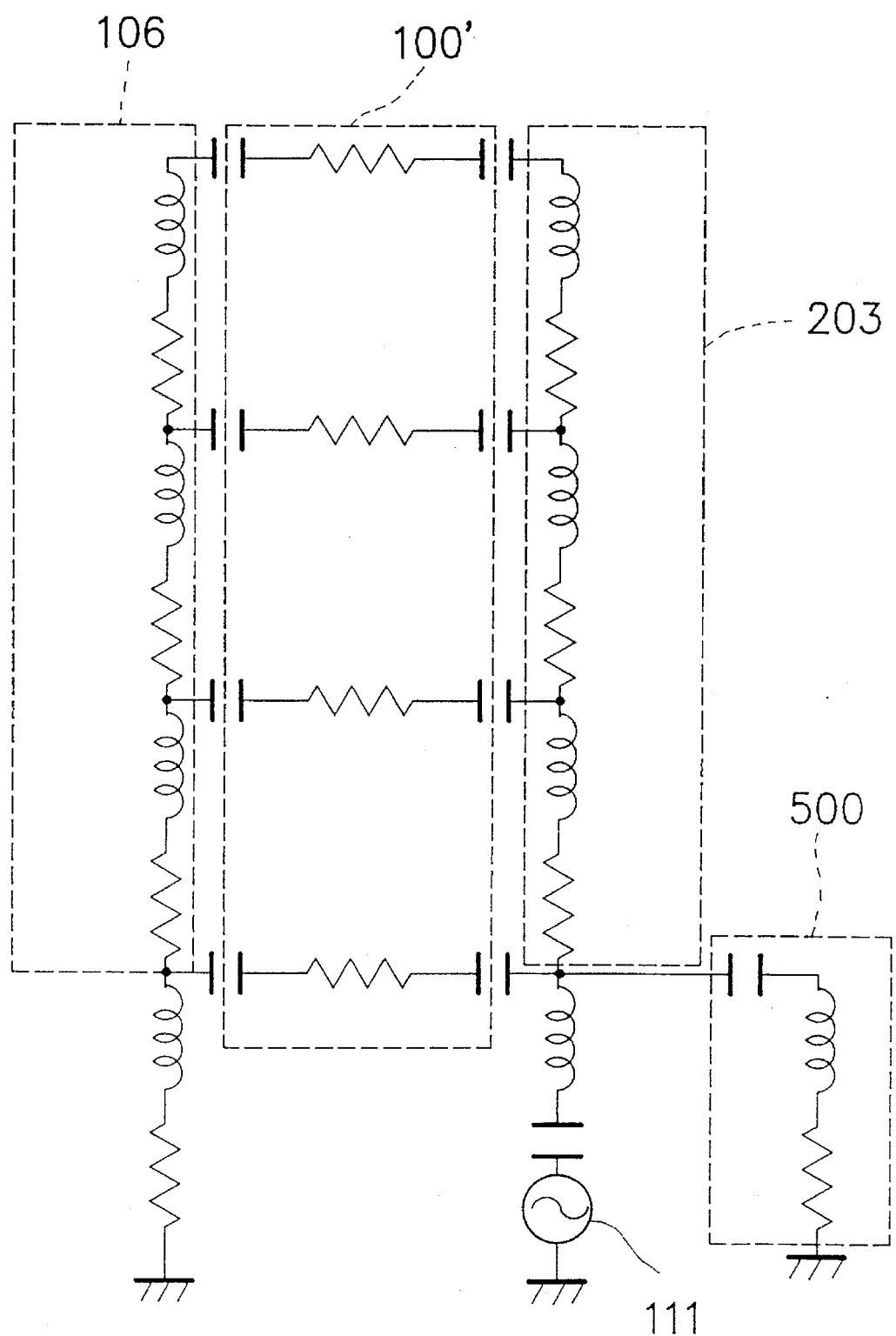
FIG. 10 is a schematic view illustrating an equivalent circuit in a plasma CVD apparatus.

The foregoing equivalent circuit, which was presumed by the present inventors, in the apparatus used in Experiment 3 is of the mechanism shown in FIG. 10.

In FIG. 10, reference numeral 111 indicates a high frequency power source, reference numeral 203 a cathode electrode, reference numeral 106 a cylindrical substrate, reference numeral 100' plasma, and reference numeral 500 an earth shield.

The equivalent circuit shown in FIG. 10 illustrates such situation as will be described in the following. That is, a high frequency power outputted from the high frequency power source 111 is impressed and propagated onto the cathode electrode 203, wherein the plasma 100' is generated by virtue of a high frequency electric field between the cathode electrode 103 and the cylindrical substrate 106 situated oppositely to said cathode electrode, whereby causing the formation of a deposited film on the cylindrical substrate 106.

Based on the above equivalent circuit, the related constituents were substituted by a given resistance coil (a given inductance) and a given condenser (a capacitance) and they were expressed in terms of impedance by the following equations (1) to (4).

(a) Cathode Electrode: the impedance Zc of the cathode electrode can be expressed by the following equation (1), in which Rc is a skin resistance component of the cathode electrode, and Lc is an inductance component of the cathode electrode.

$$Zc = Rc + j\omega Lc \qquad (1)$$

(wherein, j is an imaginary unit, ω is an angular frequency of the high frequency power)

(b) Plasma: the impedance Zp of the plasma can be expressed by the following equation (2), in which Rp is a net resistance component of the plasma, and Cp is a capacitance component of an ion sheath at the boundaries between the plasma and the cathode electrode and cylindrical substrate.

$$Zp = Rp + 1/j\omega Cp \qquad (2)$$

(c) Cylindrical Substrate: the impedance Za of the cylindrical substrate as an anode electrode can be expressed by the following equation (3), in which Ra is a shin resistance component of the cylindrical substrate, and La is an inductance component thereof.

$$Za = Ra + j\omega La \qquad (3)$$

(d) The impedance Zs of the earth shield situated in the vicinity of the high frequency power source can be expressed by the following equation (4), in which Ra is a skin resistance component of the earth shield, Ls is an inductance component thereof, and Cs is a capacitance component between the cathode electrode and earth shield.

$$\dot{Z}s = Rs + j\omega Ls + 1/j\omega Cs \qquad (4)$$

Based on the above equations (1) to (4), studies were made of phenomena occurred when the frequency of the high frequency power was increased, to obtain the following findings.

(i) When the frequency of the high frequency power used is increased, the impedance Zp of the cathode electrode is enlarged accordingly and the high frequency power at the cathode electrode is gradually decayed as it propagates from the introduction portion thereof through the surface of the cathode electrode.

(ii) The impedance Zp of the plasma in contact with the cathode electrode is decreased as the frequency of the high frequency power used is increased because its capacitance impedance component $1/j\omega Cp$ is decreased. This situation permits the high frequency power to largely flow to the plasma side rather than onto the cathode electrode, wherein the voltage of the high frequency power to propagate on the surface of the cathode electrode is decayed accordingly. In this consequence, when the frequency of the high frequency power is increased, there is occurred a variation for the voltage of the high frequency power flown onto the cathode electrode, wherein plasma is generated in a localized state.

(iii) The impedance Zp between the plasma and the earth shield is increased in response to a decrease in the capacitance component Cp when the frequency of the high frequency power used is increased. And, even when the cylindrical substrate should be grounded or insulated, or applied with a given electric potential, there is present a certain impedance Za between the cylindrical substrate and the earth with respect to the propagation of the high frequency power. Herein, when the impedance Zs between the cathode electrode and the earth shield is smaller than either the impedance Zp of the plasma between the cathode electrode and the cylindrical substrate or the impedance of the cathode electrode, the high frequency current largely flows to the earth shield, wherein the discharge in the vicinity of the earth shield becomes intense to cause localization for the plasma generated. Particularly, in this case, the discharge occurred between the cathode electrode and the cylindrical substrate is relatively weakened and the discharge occurred in the vicinity of the earth shield is relatively intensified and as a result, the plasma generated becomes uneven in terms of the density, wherein the film formed becomes uneven in terms of the thickness.

Based on the above findings, the present inventors discussed of the phenomena observed in Experiment 2 and Experiment 3. That is, as above described, in Experiment 2, strong plasma luminescence was observed in the vicinity of the earth shield 500A when the the frequency of the high frequency power source 111 was made to be 60 MHz or more. Similarly, in Experiment 3, strong plasma luminescence was observed in the vicinity of the earth shield 500A upon the plasma density measurement in the case of the high frequency with 100 MHz. Discussion was made of these phenomena while referring to the above findings. As a result, there were obtained findings that when the high frequency power used is made to be of a frequency of 60 MHz or more and wherein a relevant earth shield should be disposed, as apparent from the foregoing findings, the plasma generated becomes localized in the vicinity of the earth shield; wherein the high frequency power is greatly consumed to cause the generation of intense discharge in the vicinity of the earth shield, wherein relatively dense plasma is locally generated to produce a relatively large quantity of active species in the vicinity of the earth shield and an uneven concentration distribution is caused for active species to arrive at the cylindrical substrate, resulting in the formation of a deposited film uneven in both thickness and quality on the cylindrical substrate.

EXPERIMENTS 4 AND 5

The present inventors made studies in order to find out a manner capable of preventing the occurrence of such phenomena observed in Experiments 2 and 3 in which the high frequency power is largely consumed locally in the vicinity of the earth shield.

The studies were conducted in a viewpoint A concerning the constituent material of the earth shield and in a viewpoint B of preventing the occurrence of the discharge in the vicinity of the earth shield.

As for the viewpoint A, studies were made of other materials than the constituent material (aluminum) of the earth shield used in Experiment 3. The constituent aluminum material (Al) of the earth shield used in Experiment 3 is a non-magnetic material. The present inventors provided various magnetic materials which are different from said non-magnetic material and examined of their usability as the earth shield. As for the use of these magnetic material as the earth shield, the present inventors considered the following two manners; (a) a manner in which the earth shield is constituted by such magnetic material, and (b) a manner in which the earth shield is constituted by a non-magnetic material and such magnetic material.

Firstly, discussion was made of the manner A. That is, when the earth shield was constituted by a given ferromagnetic material only, there was formed a magnetic field around the earth shield.

Herein, it is known that when a magnetic field is intentionally applied in the vicinity of the area where plasma is generated, a turning motion of electron is occurred therein to thereby facilitate the plasma generation.

In view of this, it was found that the use of the earth shield constituted by such ferromagnetic material only cannot effectively prevent the occurrence of discharge in the vicinity of the earth shield.

In addition, when the earth shield was constituted by a given soft magnetic material only, it was found that the soft magnetic material is unavoidably present at the periphery of the path for a high frequency power, which is applied to the cathode electrode, to propagate wherein a magnetic field is formed by the high frequency power, and by virtue of the action of said magnetic field, the soft magnetic material results in providing a magnetic field opposite said magnetic field and that this situation prevents the high frequency from being effectively applied. In consequence, the manner (a) was found to be practically unacceptable.

In view of the results in the above, the present inventors studied of the manner (b). In this case, there was used a given soft magnetic material as the magnetic material. Particularly, there were prepared a plurality of earth shields having a two-layered structure comprising a non-magnetic material disposed on the side of the path for a high frequency power applied to propagate and a soft magnetic material disposed on the side which is exposed to plasma. These earth shields are of the constitutions each comprising the corresponding non-magnetic material and soft magnetic material in combination shown in Table 5. In FIG. 5, there are shown a resistance value against the frequency of 100 MHz and another resistance value against the frequency of 50 MHz as for each constituent material for each earth shield. Practical usability was examined as for each of these two-layered earth shields through experiments. As a result, each of them was found to be practically usable. Details of this situation will be described in the following Experiment 4.

As for the foregoing viewpoint B, studies were conducted in the following Experiment 5 wherein a manner of covering a position for an earth shield to be contacted with plasma using an insulating material.

EXPERIMENT 4

Using a plasma CVD apparatus provided with earth shields having a two-layered structure comprising a non-magnetic material on the cathode electrode side and a soft magnetic material on the plasma region side, film formation was conducted to examine the effectiveness of the earth shield.

Figure 11:
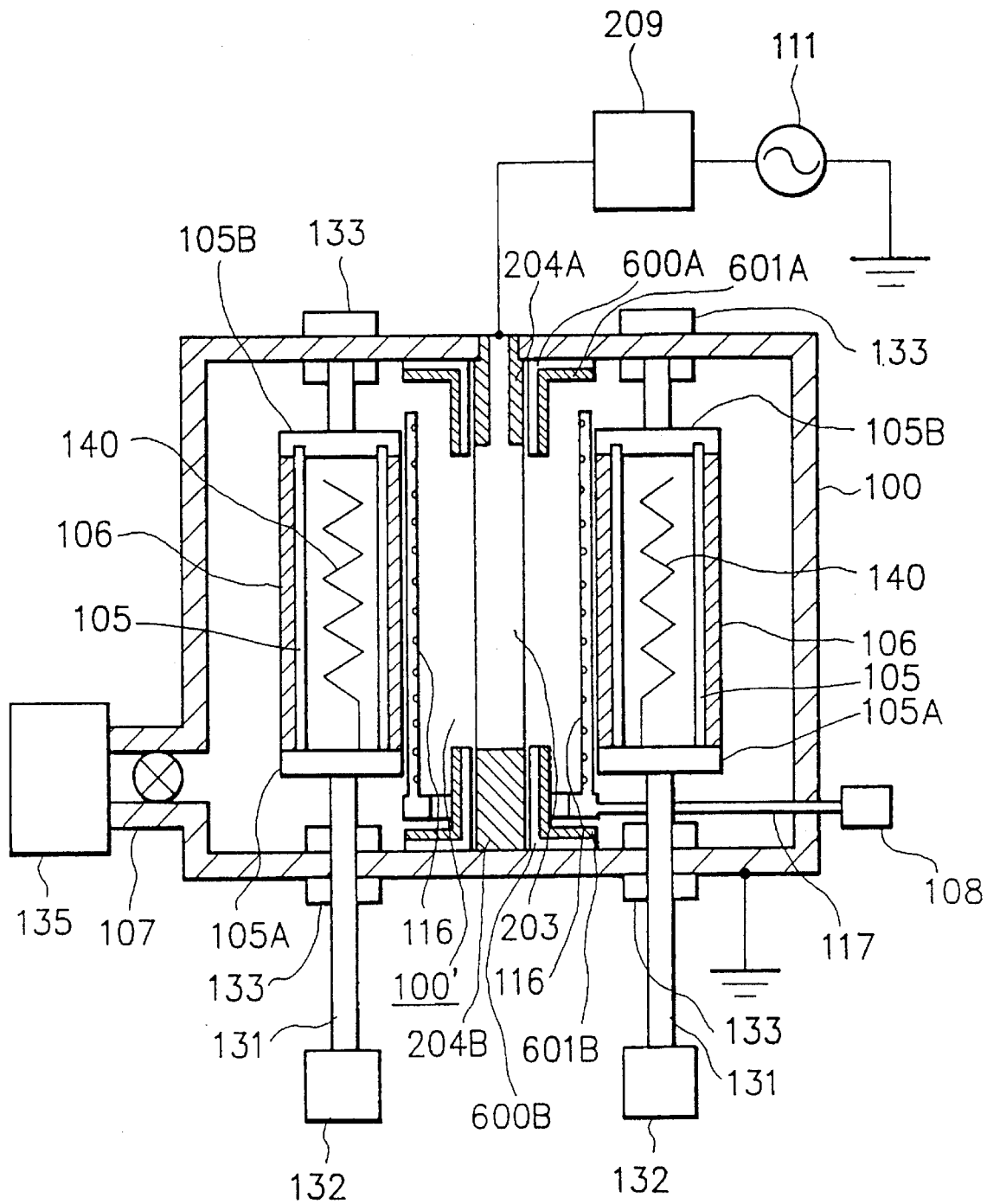
FIG. 11 is a schematic diagram of an example of a plasma CVD apparatus according to the present invention.

The plasma CVD apparatus used in this experiment is of the constitution shown in FIG. 11. The plasma CVD apparatus shown in FIG. 11 is of the same constitution as that of the apparatus shown in FIG. 5, except that each of the earth shields 500A and 500B in the apparatus shown in FIG. 5 is replaced by an earth shield having a two-layered structure comprising a non-magnetic member 600A or 600B made of aluminum and a soft magnetic member 601A or 601B made of 45 Permalloy.

In this experiment, in the same manner as in Experiment 2, there were conducted a plurality of runs under the film forming conditions shown in Table 1 and respective frequency conditions shown in Table 6 and wherein the gas pressure in the inside of the reaction chamber upon film formation was made constant at 50 mTorr, whereby obtaining Samples Nos. 21 to 30 each comprising six electrophotographic photosensitive members. In each run, as the six cylindrical substrates 106, there were used six aluminum cylindrical substrates of 108 mm in outer diameter, 358 mm in length and 5 mm in thickness, and on the surface of each aluminum cylindrical substrate, there were formed a charge injection inhibition layer, a photoconductive layer and a surface protective layer in the named order. The film formation in the preparation of each of Samples Nos. 21 to 29 was performed as desired. But in the film formation in the preparation of Sample No. 30, discharge was discontinuously occurred and because of this, the film formation was not performed as desired.

Each of the resultant Samples Nos. 21 to 29 was subjected to evaluation in the same manner as in Experiment 1. The evaluated results obtained are collectively shown in Table 6.

Based on the results shown in Table 6, there were obtained the following findings. That is, by using the earth shield having the two-layered structure comprising the non-magnetic member situated on the cathode electrode side and the soft magnetic member situated on the plasma region side, (i) the occurrence of intense discharge in the vicinity of the earth shield can be effectively prevented and because of this, the occurrence of a thickness distribution variation for deposited films formed is prevented; (ii) in the film formation using a frequency in the range of 13.56 MHz to 150 MHz, there are obtained deposited films which are slight in thickness distribution variation and excellent in electrophotographic characteristics; but (iii) in the film formation using a frequency of beyond 150 MHz, there is a tendency that deposited films formed become remarkable in thickness distribution variation, wherein the image-forming properties of said deposited films become worse in accordance with the magnitude of their thickness distribution variation.

EXPERIMENT 5

There were prepared a plurality of electrophotographic photosensitive members using a plasma CVD apparatus provided with earth shields each having a coat comprising an insulating material covered its exterior portions liable to expose to plasma.

Figure 12:
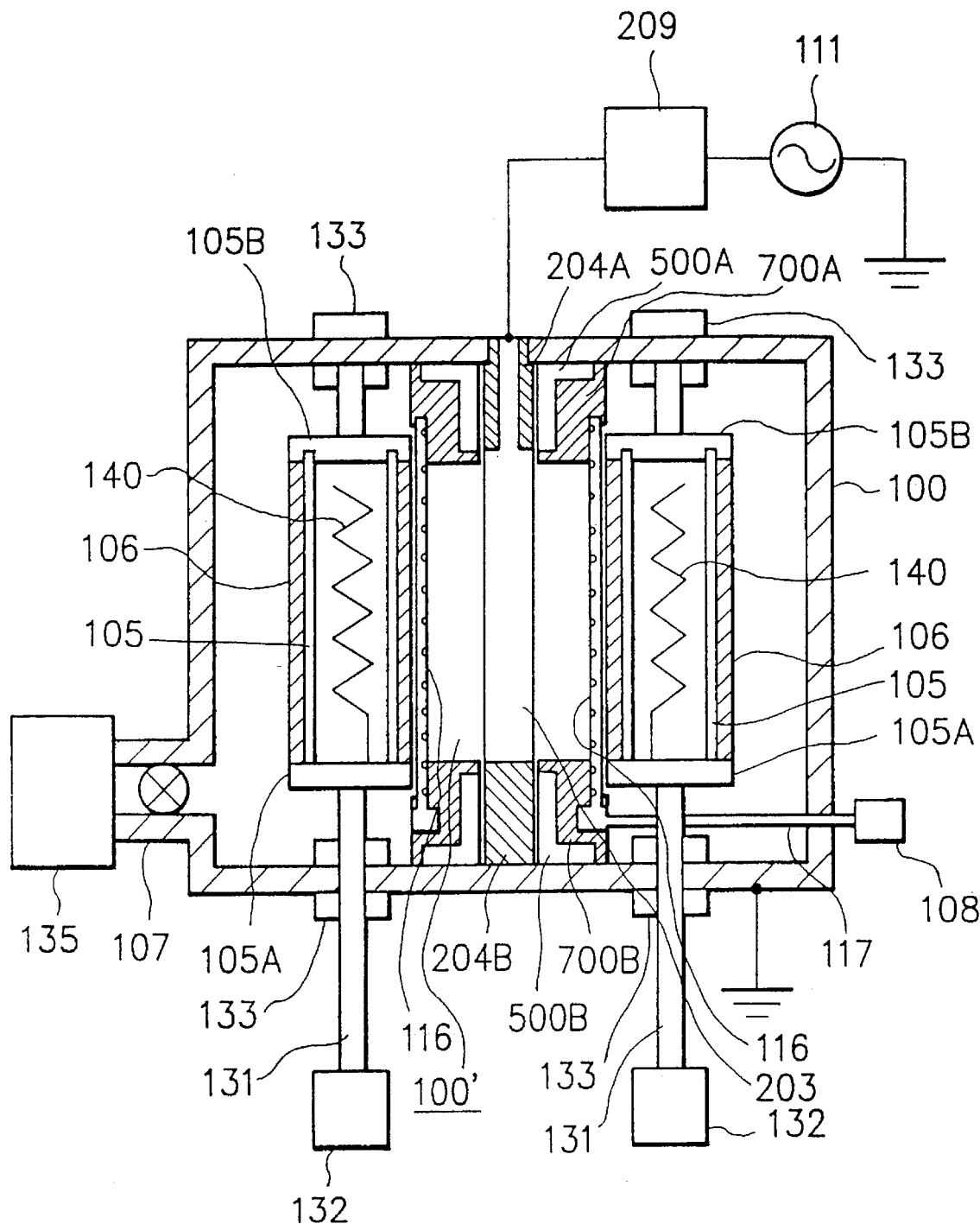
FIG. 12 is a schematic diagram of another example of a plasma CVD apparatus according to the present invention.

The plasma CVD apparatus used in this experiment is of the constitution shown in FIG. 12. The plasma CVD apparatus shown in FIG. 12 is of the same constitution as that of the apparatus shown in FIG. 5, except that the entire exterior of each of the earth shields 500A and 500B in the apparatus shown in FIG. 5 is covered by an insulating member 700A or 700B made of a $Al_2O_3$ material.

In this experiment, in the same manner as in Experiment 2, there were conducted a plurality of runs under the film forming conditions shown in Table 1 and respective frequency conditions shown in Table 7 and wherein the gas pressure in the inside of the reaction chamber upon film formation was made constant at 50 mTorr, whereby obtaining Samples Nos. 31 to 40 each comprising six electrophotographic photosensitive members. In each run, as the six cylindrical substrates 106, there were used six aluminum cylindrical substrates of 108 mm in outer diameter, 358 mm in length and 5 mm in thickness, and on the surface of each aluminum cylindrical substrate, there were formed a charge injection inhibition layer, a photoconductive layer and a surface protective layer in the named order. The film formation in the preparation of each of Samples Nos. 31 to 39 was performed as desired. But in the film formation in the preparation of Sample No. 40, discharge was discontinuously occurred and because of this, the film formation was not performed as desired.

Each of the resultant Samples Nos. 31 to 39 was subjected to evaluation in the same manner as in Experiment 1. The evaluated results obtained are collectively shown in Table 7.

Based on the results shown in Table 7, there were obtained the following findings. That is, by using the earth shield covered by the insulating member, (i) even in the film formation using a frequency of 60 MHz or more, the occurrence of intense discharge in the vicinity of the earth shield can be effectively prevented and because of this, the occurrence of a thickness distribution variation for deposited films formed is prevented; (ii) in the film formation using a frequency in the range of 13.56 MHz to 150 MHz, there are obtained deposited films which are slight in thickness distribution variation and excellent in electrophotographic characteristics; but (iii) in the film formation using a frequency of beyond 150 MHz, there is a tendency that deposited films formed become remarkable in thickness distribution variation, wherein the image-forming properties of said deposited films become worse in accordance with the magnitude of their thickness distribution variation.

EXPERIMENT 6

As above described, from the results obtained in each of the above Experiments 4 and 5, it was found that in the case where the earth shields are specifically designed as above described, desirable electrophotographic photosensitive members excelling in electrophotographic characteristics can be effectively obtained in the film formation using a high frequency power of 150 MHz or less in frequency but in the film formation using a high frequency power of beyond 150 MHz in frequency, there is a tendency that deposited films formed become remarkable in thickness distribution variation wherein the image-forming properties of said deposited films become worse in accordance with the magnitude of their thickness distribution variation. In view of these findings, studies were made while focusing on the impedance of the cathode electrode in this experiment.

Now, in the case where the cathode electrode comprises a cylindrical electrode of a in outer diameter and l in length, the inductance L of the cathode electrode can be expressed by the following equation.

$$L=\mu_o/2\pi\times[l\cdot l_n[\{1+(a^2+l^2)^{1/2}\}/a]-\{(a^2+l^2)^{1/2}\}-a]$$

(wherein $\mu_o$ is a magnetic permeability of the vacuum)

Using this equation, the impedance Z ($Z=\omega L+Rc$) of each of the cathode electrodes of 70 mm in outer diameter and 400 mm in length used in Experiments 2 to 5 was examined in the film formation using each of a high frequency power of 150 MHz in frequency and a high frequency power of 200 MHz in frequency. As a result, there were obtained the following results. Herein, as for the cathode electrode constituted by a non-magnetic material such as aluminum, there was made to be $Z=\omega L$ since its resistance value Rc is of a negligible magnitude in comparison with its impedance $\omega L$.

Frequency 150 MHz: $Z=167 \Omega$
Frequency 200 MHz: $Z=223 \Omega$

Because of the foregoing findings in Experiments 4 and 5 wherein in the film formation using a high frequency power of 150 MHz or less in frequency, there can be obtained electrophotographic photosensitive members free of thickness distribution variation and excelling in electrophotographic characteristics, studies were made of cathode electrodes having a smaller impedance of less than 167 $\Omega$. Particularly, using the above described equation, the outer diameter was obtained as for the cathode electrodes which provide an impedance of 150 $\Omega$ or less when their length is 400 mm. As a result, there were the following cases wherein the impedance Z was 150 $\Omega$ or less.

Frequency 150 MHz: the electrode's outer diameter is 90 mm or more;
Frequency 200 MHz: the electrode's outer diameter is 160 mm or more;
Frequency 250 MHz: the electrode's outer diameter is 240 mm or more; and
Frequency 300 MHz: the electrode's outer diameter is 310 mm or more.

Then, there was provided a modification of the apparatus shown in FIG. 11 which can comply with a high frequency power of up to 300 MHz in frequency and wherein the cathode electrode 203 of the apparatus shown in FIG. 11 is replaced by an aluminum cathode electrode of 320 mm in outer diameter and 400 mm in length, and in accordance with this, the size and fixing position of each of the earth shield members 600A, 600B, 601A and 601B are properly adjusted.

Using this apparatus, in the same manner as in Experiment 4, there were prepared a plurality of electrophotographic photosensitive members. Particularly, in the same manner as in Experiment 4, there were conducted a plurality of runs under the film forming conditions shown in Table 1 and respective frequency conditions shown in Table 8 and wherein the gas pressure in the inside of the reaction chamber upon film formation was made constant at 50 mTorr, whereby obtaining Samples Nos. 41 to 50 each comprising six electrophotographic photosensitive members. In each run, as the six cylindrical substrates 106, there were used six aluminum cylindrical substrates of 108 mm in outer diameter, 358 mm in length and 5 mm in thickness, and on the surface of each aluminum cylindrical substrate, there were formed a charge injection inhibition layer, a photoconductive layer and a surface protective layer in the named order. Each of the resultant Samples Nos. 41 to 49 was subjected to evaluation in the same manner as in Experiment 1. The evaluated results obtained are collectively shown in Table 8.

In the film formation in the preparation of Sample No. 50, discharge was discontinuously occurred and because of this, the film formation was not performed as desired.

Based on the results shown in Table 8, there were obtained the following findings. That is, by using the cylindrical cathode electrode having an outer diameter adjusted as above described in addition to the use of the earth shield having the two-layered structure comprising the non-magnetic member situated on the cathode electrode side and the soft magnetic member situated on the plasma region side, even in the film formation using a high frequency power of 150 MHz or more in frequency, the occurrence of a thickness distribution variation for deposited films formed can be prevented to a reduced level, and there can be obtained electrophotographic photosensitive members excelling in electrophotographic characteristics at a high deposition rate.

EXPERIMENT 7

In view of the results obtained in Experiment 6, this experiment was conducted in the same manner as in Experiment 5, using a modification of the apparatus shown in FIG. 12 in which the size of the cathode electrode in said apparatus is changed.

The apparatus used in this experiment is of the same constitution as that of the apparatus shown in FIG. 12, except that the cathode electrode 203 in the apparatus shown in FIG. 12 is replaced by an aluminum cylindrical cathode electrode of 320 mm in outer diameter and 400 mm in length and in accordance with this, the size and fixing position of each of the earth shield members 500A and 500B and the $Al_2O_3$ insulating members 700A and 700B are properly adjusted.

Using this apparatus, there were prepared a plurality of electrophotographic photosensitive members in the same manner as in Experiment 5. Particularly, in this experiment, in the same manner as in Experiment 5, there were conducted a plurality of runs under the film forming conditions shown in Table 1 and respective frequency conditions shown in Table 9 and wherein the gas pressure in the inside of the reaction chamber upon film formation was made constant at 50 mTorr, whereby obtaining Samples Nos. 51 to 60 each comprising six electrophotographic photosensitive members. In each run, as the six cylindrical substrates 106, there were used six aluminum cylindrical substrates of 108 mm in outer diameter, 358 mm in length and 5 mm in thickness, and on the surface of each aluminum cylindrical substrate, there were formed a charge injection inhibition layer, a photoconductive layer and a surface protective layer in the named order. Each of the resultant Samples Nos. 51 to 59 was subjected to evaluation in the same manner as in Experiment 1. The evaluated results obtained are collectively shown in Table 9.

In the film formation in the preparation of Sample No. 60, discharge was discontinuously occurred and because of this, the film formation was not performed as desired.

Based on the results shown in Table 9, there were obtained the following findings. That is, by using the cylindrical cathode electrode having an outer diameter adjusted to such value described in Experiment 6 in addition to the use of the earth shield covered by thee insulating member, even in the film formation using a high frequency power of 150 MHz or more in frequency, the occurrence of a thickness distribution variation for deposited films formed can be prevented to a reduced level, and there can be obtained electrophotographic photosensitive members excelling in electrophotographic characteristics at a high deposition rate.

DESCRIPTION OF THE PREFERRED EMBODIMENTS

The present invention has been accomplished based on the results obtained in the foregoing Experiments 1 to 7.

The present invention includes a plasma CVD process using a high frequency energy of a very-high-frequency (VHF) range and a plasma CVD apparatus suitable for practicing said plasma CVD process.

The plasma CVD process according to the present invention comprises conducting film formation in a reaction chamber capable of being substantially vacuumed in which a plurality of cylindrical substrates are spacedly arranged on a concentric circle in said reaction chamber such that a desired discharge space is formed at the central position of the inside of said reaction chamber and a cathode electrode is disposed at the central position of said discharge space, by introducing a film-forming raw material gas into said discharge space and applying a high frequency power from a high frequency power source to said cathode electrode to produce plasma between said plurality of cylindrical substrates and said cathode electrode, whereby forming a deposited film on the surface of each of said plurality of cylindrical substrates, characterized in that an earth shield comprising a non-magnetic material and a soft magnetic material or an insulating material being stacked is disposed at each of the opposite end portions of said cathode electrode, and a very-high-frequency energy of a frequency range of 60 MHz or more from said high frequency power source is applied to said cathode electrode to produce plasma in said reaction chamber whereby forming a deposited film on the surface of each of said plurality of cylindrical substrates.

The plasma CVD apparatus according to the present invention comprises a reaction chamber capable of being substantially vacuumed, a gas feed means for introducing a film-forming raw material gas into said reaction chamber, a plurality of rotatable substrate holders spacedly arranged on a concentric circle in said reaction chamber so as to form a discharge space at the central position of the inside of said reaction chamber, a cathode electrode disposed at the central position of said discharge space, and a high frequency power source, wherein a high frequency power from said high frequency power source is applied to said cathode electrode to produce plasma between a plurality of cylindrical substrates each being positioned on one of said plurality of substrate holders and said cathode electrode to thereby form a deposited film on the surface of each of said plurality of cylindrical substrates, characterized in that an earth shield comprising a non-magnetic material and a soft magnetic material or an insulating material being stacked is disposed at each of the opposite end portions of said cathode electrode, and said reaction chamber is designed to allow a very-high-frequency energy of a frequency range of 60 MHz or more from said high frequency power source to be applied to said cathode electrode.

The cathode electrode used in the present invention is desired to provide an impedance of 150 Ω or less against the frequency of the high frequency power source.

According to the present invention, there can be efficiently formed, on each of the surface of a plurality of large area substrates, i.e., a plurality of cylindrical substrates, a deposited film having a high quality similar to a deposited film formed by the conventional RF plasma CVD process using a high frequency energy of 13.56 MHz at a high deposition rate and at a high raw material gas utilization efficiency without occurrence of the foregoing problems in the microwave plasma CVD process. Particularly, on the surface of each of said cylindrical substrates, there can be effectively formed a high quality deposited film having a remarkably uniform thickness and homogeneous film quality in relation to not only the longitudinal axis direction but also the circumferential direction of the cylindrical substrate at a high deposition rate and at a high raw material gas utilization efficiency.

Now, in the conventional film-forming manner using a high frequency power, a problem unavoidably entail in that the loss of the high frequency energy is increased as the frequency of the high frequency power is increased.

In the present invention, such energy loss is extremely lessened although a very-high-frequency energy of a markedly large frequency range is used, and a film-forming raw material gas is efficiently decomposed to produce plasma in a desirable state, whereby desirable deposited films are effectively formed at a high deposition rate. Therefore, according to the present invention, there can be efficiently produce large area and high quality semiconductor devices. Particularly, according to the present invention, large area deposited film products excelling in electrophotographic characteristics can be stably mass-produced.

In the following, the present invention will be detailed while referring to the drawings.

Shown in FIG. 11 is an example of a plasma CVD apparatus suitable for practicing the plasma CVD process according to the present invention.

In FIG. 11, reference numeral 100 indicates a reaction chamber. Reference numeral 106 indicates a plurality of cylindrical substrate for film formation, each being positioned on a substrate holder 105. The cylindrical substrate 106 comprises six cylindrical substrates arranged in the reaction chamber such that they are spacedly positioned on a concentric circle so as to form a space (that is, a discharge space 100') at the central position of the inside of the reaction chamber. Each substrate holder 105 is provided with an electric heater which is installed in the inside thereof such that it can heat the cylindrical substrate 106 positioned thereon from the back of said cylindrical substrate. Each substrate holder 105 is connected to a rotary shaft 131 connected to a motor 132 so that the substrate holder can be rotated. Each of reference numerals 105A and 105B indicates an auxiliary support member for the cylindrical substrate 106. Reference numeral 203 indicates a cathode electrode arranged at the central position of the discharge space 100' circumscribed by the concentrically arranged six cylindrical substrates 106. The cathode electrode 203 is electrically connected to a high frequency power source 111 through a matching circuit 209. Each of reference numerals 204A and 204B indicates an insulating member which electrically isolates the cathode electrode 203 from the reaction chamber 100. An earth shield having a two-layered structure comprising a non-magnetic material 600A or 600B and a soft magnetic material 601A or 601B is disposed to cover the exterior of each of the insulating members 204A and 204B. Each of the non-magnetic materials 600A and 600B is designed to position on the inside, that is, on the side of the propagation path for a high frequency power applied to the cathode electrode 203, and each of the soft magnetic materials 601A and 601B is designed to position on the outside, that is, on the side to be exposed to plasma. Reference numeral 107 indicates an exhaust pipe provided with an exhaust valve. The exhaust pipe is connected to an exhausting mechanism 135 provided with a vacuum pump. Reference numeral 108 indicates a raw material gas supply system having gas reservoirs, mass flow controllers and valves. The raw material gas supply system 108 is connected through a gas supply pipe 117 to gas liberation pipes 116 each having a plurality of gas liberation holes.

Shown in FIG. 12 is another example of a plasma CVD apparatus suitable for practicing the plasma CVD process according to the present invention. The apparatus shown in FIG. 12 is a partial modification of the apparatus shown in FIG. 11 in which the soft magnetic material of each earth shield is replaced by an insulating material. Particularly, each earth shield in the apparatus shown in FIG. 12 comprises a two-layered structure comprising a non-magnetic material 500A or 500B and an insulating material 700A or 700B which is disposed so as to cover the exterior of the insulating member 204A or 204B. Each of the non-magnetic materials 500A and 500B is designed to position on the inside, that is, on the side of the propagation path for a high frequency power applied to the cathode electrode 203, and each of the insulating materials 700A and 700B is designed to position on the outside, that is, on the side to be exposed to plasma.

Specific examples of the non-magnetic material to constitute the earth shield in the present invention are Al, Cu, SUS 304, SUS316, and SUS316L. The soft magnetic material to constitute the earth shield is desired to be a soft magnetic material of 200 or more in relative magnetic permeability. Specific examples of such soft magnetic material are ferrite, grain oriented silicon steel, Alperm, Sendust, 78Permalloy, 45permalloy, Supermalloy, Mumetal, Permendure, and 45-25Perminver.

The insulating member to circumscribe the earth shield is desired to be comprised of quartz, alumina, boron nitride, or Teflon.

As above described, in the present invention, the cathode electrode is disposed at the central position in the discharge space circumscribed by a plurality of cylindrical substrates. The cathode electrode herein is desired to be arranged at the central position in the discharge space while maintaining an equal distance to each of the cylindrical substrates.

As for the number of the cylindrical substrates spacedly arranged in the reaction chamber, it should be properly determined while having a due care about the related factors such as the capacity of the reaction chamber, the outer diameter of a cylindrical substrate used, and the magnitude of a high frequency power applied. However, in general, it is made to be in the range of 3 to 15.

As for the distance between the cathode electrode and each of the cylindrical substrates, it should be properly determined while having a due care so that uniform plasma can be continuously produced in a desirable state in the discharge space. However, in a preferred embodiment, it is determined in the range of 20 mm to 20 cm.

The plasma CVD process according to the present invention is conducted, for instance, in the following manner. Description will be made in the case where it is conducted using the plasma CVD apparatus shown in FIG. 11.

Each cylindrical substrate 106 is positioned on the corresponding substrate holder 105A. Then, the reaction chamber 100 is evacuated by operating the exhausting mechanism 135 to bring the inside thereof to a desired vacuum. After this, the electric heaters 140 are energized to heat the cylindrical substrates 106 to a desired temperature, and they are maintained at this temperature. Thereafter, film-forming raw material gas from the gas supply system 108 is introduced into the reaction chamber 100 through the gas supply pipe 117 and the gas liberation pipes 116. The inside of the reaction chamber is then controlled to a desired gas pressure. Successively, the high frequency power source 111 is switched on to apply a high frequency power of 60 MHz or more in frequency to the cathode electrode 203 through the matching circuit 209. By this, the film-forming raw material gas is decomposed with the action of the high frequency energy to produce active species in the discharge space circumscribed by the cylindrical substrates 106 and the cathode electrode 106, whereby causing the formation of a deposited film on each of the cylindrical substrates 106.

The quantity of the high frequency power applied to the cathode electrode upon the film formation in the present invention should be properly determined within a given range at which plasma is desirably generated. However, in general, it is desired to be preferably in the range of 0.001 $W/cm^2$ to 10 $W/cm^2$ or more preferably, in the range of 0.01 $W/cm^2$ to 5 $W/cm^2$.

As for the frequency of the high frequency power used in the present invention, it is preferably 60 MHz or more, more preferably in the range of 60 MHz to 300 MHz, most preferably in the range of 100 MHz to 250 MHz.

As for the film-forming gas used in the present invention, any conventional raw material gases capable of contributing to film formation can be selectively used depending upon the kind of a deposited film to be formed.

Specifically, for example, in the case of forming a-Si series deposited films, monosilane gas, disilane gas, other higher order silane gases, and mixtures of two or more of these gases can be selectively used. In the case of forming other deposited films, there can be selectively used appropriate raw material gases such as germane gas, methane gas, ethylene gas, and mixtures of two or more these gases. In any case, it is possible for the film-forming raw material gas to be introduced into the reaction chamber together with appropriate carrier gas. Specific examples of such carrier gas are hydrogen gas and inert gases such as argon gas, helium gas, and the like.

In the present invention, it is possible to use appropriate raw material gas capable of contributing to adjusting the characteristics including a band gap for deposited films to be formed. Specific examples of such gas are nitrogen atom-containing gases such as nitrogen gas, ammonia, and the like; oxygen atom-containing gases such as oxygen gas, nitrogen oxide, dinitrogen oxide, and the like; hydrocarbon gases such as methane, ethane, ethylene, acetylene, propane, and the like; gaseous fluorine-containing compounds such as silicon tetrafluoride, silicon hexafluoride, germanium tetrafluoride, and the like; and mixtures of two or more of these gaseous materials.

In the present invention, deposited films to be formed may be doped using appropriate doping gas. As such doping gas, there can be mentioned, for example, gaseous diborane, boron fluoride, phosphine, and phosphorous fluoride.

As for the gas pressure in the inside of the reaction chamber upon the film formation, it may be an appropriate gas as long as plasma is produced in a desirable state therein. Specifically, for example in the case of forming a-Si series deposited film, it is preferably 5 Torr or less, more preferably in the range of 0.1 mTorr to 3 Torr, most preferably in the range of 0.3 mTorr to 500 mTorr.

As for the substrate temperature upon the film formation, it should be properly determined depending upon the kind of a deposited film to be formed. Specifically, in the case of forming amorphous silicon series deposited films, it is preferably in the range of 20° C. to 500° C., more preferably in the range of 50° C. to 450° C.

EXAMPLES

In the following, the present invention will be described in more detail with reference to examples. It should be understood that the present invention is not restricted by these examples.

Example 1

Using the apparatus shown in FIG. 11 having a high frequency power source of 60 MHz in frequency as the high frequency power source 111, there were prepared six electrophotographic photosensitive members by repeating the film-forming procedures of Experiment 4 under the conditions shown in Table 1 to deposit amorphous silicon films on six cylindrical substrates. As the substrates 106, there were used six aluminum cylindrical substrates of 108 mm in outer diameter and 358 mm in length.

The film formation in the above was conducted in the following manner. That is, the six aluminum cylindrical substrates were positioned respectively on the corresponding substrate holder 105. The reaction chamber 100 was then evacuated to bring the inside thereof to a vacuum of $1\times10^{-6}$ Torr by operating the exhausting mechanism 135. Thereafter, the cylindrical substrates 106 were started rotating, and the electric heaters 140 were energized to heat the cylindrical substrates 106 to 250° C. and they were maintained at this temperature. In each film formation, the corresponding film-forming raw material gases shown in Table 1 were introduced from the gas supply system 108 into the reaction chamber 100 through the gas supply pipe 117 and the gas liberation pipes 116 under the conditions shown in Table 1 wherein the inside of the reaction chamber was controlled to a gas pressure of 50 mTorr, and the high frequency power source 111 was switched on to apply a high frequency energy of 100 MHz in frequency to the cathode electrode 203, whereby plasma was generated in the discharge space 100'. In this way, there were formed a charge injection inhibition layer, a photoconductive layer and a surface protective layer in the named order on each cylindrical substrate. Thus, there were obtained six electrophotographic photosensitive members.

In the respective film formations in the above, the luminescence state of the plasma was optically observed. The plasma luminescence was found to be stable in the vicinity of each cylindrical substrate in each film formation.

The resultant six electrophotographic photosensitive members were subjected to evaluation with respect to charge retenditivty and image density in the same manner as in Experiment 1. As a result, each of the electrophotographic photosensitive members provided excellent evaluation results as for each of the evaluation items. Based on the evaluation results obtained, each of the resultant electrophotographic photosensitive members was found to be excellent in electrophotographic characteristics.

Comparative Example 1

The procedures of Example 1 were repeated, except that the plasma CVD apparatus was replaced by the apparatus shown in FIG. 6 having the earth shield 500A and 500B each constituted by aluminum only, to thereby obtain six electrophotographic photosensitive members. The resultant electrophotographic photosensitive members were evaluated in the same manner as in Experiment 1. As a result, each of the electrophotographic photosensitive members was found to provide remarkably uneven charge retentivity and to provide copied images which are remarkably uneven in density. Thus, the resultant electrophotographic photosensitive members were found to be practically unacceptable.

Example 2

The procedures of Example 1 were repeated, except that the apparatus shown in FIG. 11 was replaced by the apparatus shown in FIG. 12, which was used in Experiment 5, in which the high frequency power source comprises a high frequency power source of 60 MHz in frequency, to thereby obtain six electrophotographic photosensitive members. The resultant electrophotographic photosensitive members were evaluated in the same manner as in Experiment 1. As a result, each of the electrophotographic photosensitive members provided excellent evaluation results as for each of the evaluation items. Based on the evaluation results obtained, each of the resultant electrophotographic photosensitive members was found to be excellent in electrophotographic characteristics.

Example 3

The procedures of Example 1 were repeated, except that the apparatus shown in FIG. 11 was replaced by the apparatus used in Experiment 6 in which the high frequency power source comprises a high frequency power source of 100 MHz in frequency, to thereby obtain six electrophotographic photosensitive members. The resultant electrophotographic photosensitive members were evaluated in the same manner as in Experiment 1. As a result, each of the electrophotographic photosensitive members provided excellent evaluation results as for each of the evaluation items. Based on the evaluation results obtained, each of the resultant electrophotographic photosensitive members was found to be excellent in electrophotographic characteristics.

Example 4

The procedures of Example 1 were repeated, except that the apparatus shown in FIG. 11 was replaced by the apparatus used in Experiment 7 in which the high frequency power source comprises a high frequency power source of 100 MHz in frequency, to thereby obtain six electrophotographic photosensitive members. The resultant electrophotographic photosensitive members were evaluated in the same manner as in Experiment 1. As a result, each of the electrophotographic photosensitive members provided excellent evaluation results as for each of the evaluation items. Based on the evaluation results obtained, each of the resultant electrophotographic photosensitive members was found to be excellent in electrophotographic characteristics.

TABLE 1

| | | | |
|---|---|---|---|
| surface protective layer | $SiH_4$ | 100 | sccm |
| | $H_2$ | 100 | sccm |
| | $CH_4$ | 500 | sccm |
| | power applied | 800 | W |
| | pressure in the reaction chamber | 50 | mTorr |
| | film thickness | 1 | μm |
| photoconductive layer | $SiH_4$ | 500 | sccm |
| | $H_2$ | 300 | sccm |
| | power applied | 1000 | W |
| | pressure in the reaction chamber | 50 | mTorr |
| | film thickness | 25 | μm |
| charge injection inhibition layer | $SiH_4$ | 500 | sccm |
| | $H_2$ | 300 | sccm |
| | NO | 10 | sccm |
| | $B_2H_6$ | 2000 | ppm |
| | power applied | 800 | W |
| | pressure in the reaction chamber | 50 | mTorr |
| | film thickness | 1 | μm |

TABLE 2

| Sample No. | 1 | 2 | 3 | 4 | 5 | 6 | 7 | 8 | 9 | 10 |
|---|---|---|---|---|---|---|---|---|---|---|
| frequency (MHz) | 13.56 | 40.0 | 50.0 | 60.0 | 100.0 | 150.0 | 200.0 | 250.0 | 300.0 | 350.0 |
| pressure in the reaction chamber upon film formation (mTorr) | 50 | 50 | 50 | 50 | 50 | 50 | 50 | 50 | 50 | 50 |

TABLE 3

| Sample No. | 1 | 2 | 3 | 4 | 5 | 6 | 7 | 8 | 9 | 10 |
|---|---|---|---|---|---|---|---|---|---|---|
| power source frequency (MHz) | 13.56 | 40.0 | 50.0 | 60.0 | 100.0 | 150.0 | 200.0 | 250.0 | 300.0 | 350.0 |
| film thickness distribution variation in the longitudinal axis direction (%) | 30 | 33 | 35 | 36 | 41 | 44 | 46 | 51 | 53 | 56 |
| charge retentivity | X | X | X | X | X | X | X | X | X | X |
| image density | X | X | X | X | X | X | X | X | X | X |
| film dposition rate (μm/h) | — | — | — | — | — | — | — | — | — | — |

—: a case in which the value of the film thickness distribution was so large that the film deposition rate could not be figured out.

TABLE 4

| Sample No. | 11 | 12 | 13 | 14 | 15 | 16 | 17 | 18 | 19 | 20 |
|---|---|---|---|---|---|---|---|---|---|---|
| power source frequency (MHz) | 13.56 | 40.0 | 50.0 | 60.0 | 100.0 | 150.0 | 200.0 | 250.0 | 300.0 | 350.0 |
| film thickness distribution variation in the longitudinal axis direction (%) | 14 | 16 | 19 | 28 | 33 | 36 | 38 | 41 | 43 | 46 |
| charage retentivity | O | O | Δ | X | X | X | X | X | X | ⋇ |
| image density | O | O | Δ | X | X | X | X | X | X | ⋇ |
| film dposition rate (μm/h) | 4 | 16 | 18 | — | — | — | — | — | — | ⋇ |

—: a case in which the value of the film thickness distribution was so large that the film deposition rate could not be figured out.
⋇: no film formation was performed because of discontinuous discharge.

TABLE 5

| material | Al (non-magnetic material) | Cu (non-magnetic material) | SUS304 (non-magnetic material) | grain oriented silicon steel (soft magnetic material) | 45Permalloy (soft magnetic material) |
|---|---|---|---|---|---|
| resistance value (100 MHz) Ω | $3.2 \times 10^{-2}$ | $2.6 \times 10^{-2}$ | $1.7 \times 10^{-2}$ | 6.5 | 6.7 |
| resistance value (50 MHz) Ω | $2.3 \times 10^{-2}$ | $1.8 \times 10^{-2}$ | $1.2 \times 10^{-2}$ | 4.6 | 4.7 |

TABLE 6

| Sample No. | 21 | 22 | 23 | 24 | 25 | 26 | 27 | 28 | 29 | 30 |
|---|---|---|---|---|---|---|---|---|---|---|
| power source frequency (MHz) | 13.56 | 40.0 | 50.0 | 60.0 | 100.0 | 150.0 | 200.0 | 250.0 | 300.0 | 350.0 |
| film thickness distribution variation in the longitudinal axis direction (%) | 10 | 10 | 10 | 10 | 12 | 14 | 19 | 23 | 26 | ✖ |
| charge retentivity | ⊙ | ⊙ | ⊙ | ⊙ | ○ | ○ | Δ | X | X | ✖ |
| image density | ⊙ | ⊙ | ⊙ | ⊙ | ○ | ○ | Δ | X | X | ✖ |
| film dposition rate (μm/h) | 4 | 16 | 17 | 21 | 24 | 25 | 26 | — | — | ✖ |

—: a case in which the value of the film thickness distribution was so large that the film deposition rate could not be figured out.
✖: no film formation was performed because of discontinuous discharge.

TABLE 7

| Sample No. | 31 | 32 | 33 | 34 | 35 | 36 | 37 | 38 | 39 | 40 |
|---|---|---|---|---|---|---|---|---|---|---|
| power source frequency (MHz) | 13.56 | 40.0 | 50.0 | 60.0 | 100.0 | 150.0 | 200.0 | 250.0 | 300.0 | 350.0 |
| film thickness distribution variation in the longitudinal axis direction (%) | 9 | 9 | 10 | 10 | 12 | 14 | 18 | 22 | 24 | ✖ |
| charge retentivity | ⊙ | ⊙ | ⊙ | ⊙ | ○ | ○ | Δ | X | X | ✖ |
| image density | ⊙ | ⊙ | ⊙ | ⊙ | ○ | ○ | Δ | X | X | ✖ |
| film dposition rate (μm/h) | 5 | 17 | 18 | 23 | 25 | 27 | 28 | — | — | ✖ |

—: a case in which the value of the film thickness distribution was so large that the film deposition rate could not be figured out.
✖: no film formation was performed because of discontinuous discharge.

TABLE 8

| Sample No. | 41 | 42 | 43 | 44 | 45 | 46 | 47 | 48 | 49 | 50 |
|---|---|---|---|---|---|---|---|---|---|---|
| power source frequency (MHz) | 13.56 | 40.0 | 50.0 | 60.0 | 100.0 | 150.0 | 200.0 | 250.0 | 300.0 | 350.0 |
| film thickness distribution variation in the longitudinal axis direction (%) | 7 | 7 | 7 | 7 | 8 | 8 | 9 | 10 | 12 | ✖ |
| charge retentivity | ⊙ | ⊙ | ⊙ | ⊙ | ⊙ | ⊙ | ⊙ | ⊙ | ○ | ✖ |
| image density | ⊙ | ⊙ | ⊙ | ⊙ | ⊙ | ⊙ | ⊙ | ⊙ | ○ | ✖ |
| film dposition rate (μm/h) | 4 | 13 | 14 | 20 | 22 | 24 | 25 | 26 | 23 | ✖ |

—: a case in which the value of the film thickness distribution was so large that the film deposition rate could not be figured out.
✖: no film formation was performed because of discontinuous discharge.

TABLE 9

| Sample No. | 51 | 52 | 53 | 54 | 55 | 56 | 57 | 58 | 59 | 60 |
|---|---|---|---|---|---|---|---|---|---|---|
| power source frequency (MHz) | 13.56 | 40.0 | 50.0 | 60.0 | 100.0 | 150.0 | 200.0 | 250.0 | 300.0 | 350.0 |
| film thickness distribution variation in the longitudinal axis direction (%) | 6 | 6 | 7 | 7 | 7 | 8 | 8 | 10 | 11 | — |
| charge retentivity | ⊚ | ⊚ | ⊚ | ⊚ | ⊚ | ⊚ | ⊚ | ⊚ | ○ | ✗ |
| image density | ⊚ | ⊚ | ⊚ | ⊚ | ⊚ | ⊚ | ⊚ | ⊚ | ○ | ✗ |
| film dposition rate (μm/h) | 4 | 13 | 16 | 23 | 24 | 25 | 27 | 28 | 24 | ✗ |

—: a case in which the value of the film thickness distribution was so large that the film deposition rate could not be figured out.
✗: no film formation was performed because of discontinuous discharge.

We claim:

1. A plasma CVD process comprises conducting film formation in a reaction chamber capable of being substantially vacuumed in which a plurality of cylindrical substrates are spacedly arranged on a concentric circle in said reaction chamber such that a desired discharge space is formed at the central position of the inside of said reaction chamber and a cathode electrode is disposed at the central position of said discharge space, by introducing a film-forming raw material gas into said discharge space and applying a high frequency power from a high frequency power source to said cathode electrode to produce plasma between said plurality of cylindrical substrates and said cathode electrode, whereby forming a deposited film on the surface of each of said plurality of cylindrical substrates, characterized in that an earth shield comprising a non-magnetic material and a soft magnetic material or an insulating material being stacked is disposed at each of the opposite end portions of said cathode electrode, and a very-high-frequency energy of a frequency range of 60 MHz or more from said high frequency power source is applied to said cathode electrode to produce plasma in said reaction chamber whereby forming a deposited film on the surface of each of said plurality of cylindrical substrates.

2. A plasma CVD process according to claim 1, wherein the non-magnetic material of the earth shield is positioned on the side of the propagation path for the high frequency power applied to the cathode electrode, and the soft magnetic material of the earth shield is positioned on the side to be exposed to the plasma.

3. A plasma CVD process according to claim 1, wherein the very-high-frequency energy is of a frequency range of 60 MHz to 300 MHz.

4. A plasma CVD process according to claim 3, wherein the very-high-frequency energy is of a frequency range of 100 MHz to 250 MHz.

5. A plasma CVD process according to claim 3, wherein the cathode electrode is of an impedance of 150 Ω or less at the frequency range.

6. A plasma CVD process according to claim 1, wherein the very-high-frequency is applied in a quantity of 0.001 W/cm² to 10 W/cm² per a unit area of the cathode electrode.

7. A plasma CVD process according to claim 1, wherein the inside of the reaction chamber is maintained at a pressure of 5 Torr or less upon forming the deposited film.

8. A plasma CVD process according to claim 1, wherein each of the cylindrical substrates is maintained at a temperature of 20° C. to 500° C.

9. A plasma CVD process according to claim 1, wherein the deposited film is a silicon-containing deposited film.

10. A plasma CVD process according to claim 9, wherein the deposited film is for an electrophotographic photosensitive member.

11. A plasma CVD process according to claim 1, wherein the cathode electrode is arranged at a position which is equally distant from each of the cylindrical substrates in the range of 20 mm to 200 mm.

12. A plasma CVD apparatus comprising a reaction chamber capable of being substantially vacuumed, a gas feed means for introducing a film-forming raw material gas into said reaction chamber, a plurality of rotatable substrate holders spacedly arranged on a concentric circle in said reaction chamber so as to form a discharge space at the central position of the inside of said reaction chamber, a cathode electrode disposed at the central position of said discharge space, and a high frequency power source, wherein a high frequency power from said high frequency power source is applied to said cathode electrode to produce plasma between a plurality of cylindrical substrates each being positioned on one of said plurality of substrate holders and said cathode electrode to thereby form a deposited film on the surface of each of said plurality of cylindrical substrates, characterized in that an earth shield comprising a non-magnetic material and a soft magnetic material or an insulating material being stacked is disposed at each of the opposite end portions of said cathode electrode, and said reaction chamber is designed to allow a very-high-frequency energy of a frequency range of 60 MHz or more from said high frequency power source to be applied to said cathode electrode.

13. A plasma CVD apparatus according to claim 12, wherein the non-magnetic material of the earth shield is positioned on the side of the propagation path for the high frequency power applied to the cathode electrode, and the soft magnetic material of the earth shield is positioned on the side to be exposed to the plasma.

14. A plasma CVD apparatus according to claim 12, wherein the cathode electrode is in a cylindrical form.

15. A plasma CVD apparatus according to claim 12, wherein the frequency of a frequency range of 60 MHz to 300 MHz.

16. A plasma CVD apparatus according to claim 15, wherein the frequency energy is of a frequency range of 100 MHz to 250 MHz.

17. A plasma CVD apparatus according to claim 12, wherein the cathode electrode is arranged at a position which is equally distant from each of the cylindrical substrates in the range of 20 mm to 200 mm.

* * * * *

UNITED STATES PATENT AND TRADEMARK OFFICE
CERTIFICATE OF CORRECTION

PATENT NO. : 5,534,070

DATED : July 9, 1996

INVENTOR(S): NOBUYUKI OKAMURA ET AL.

It is certified that error appears in the above-identified patent and that said Letters Patent is hereby corrected as shown below:

```
On the title page, item
[56] REFERENCES CITED

Foreign Patent Documents, Line 2, "3064466 3/1991
      Japan" should read --3-64466 3/1991 Japan--.

COLUMN 1

Line 31, "enough" should be deleted.

COLUMN 2

Line 8, "a" (second occurrence) should be deleted.
   Line 43, "another" should read --other--.

COLUMN 3

Line 9, "upringht-standing" should read --upright-
      standing--.

COLUMN 4

Line 30, "An" should read --A--.

COLUMN 6

Line 6, "respect" should read --respect to--.
```

UNITED STATES PATENT AND TRADEMARK OFFICE
CERTIFICATE OF CORRECTION

PATENT NO. : 5,534,070

DATED : July 9, 1996

INVENTOR(S) : NOBUYUKI OKAMURA ET AL.

It is certified that error appears in the above-identified patent and that said Letters Patent is hereby corrected as shown below:

COLUMN 7

Line 2, "graphhic" should read --graphic--.

COLUMN 8

Line 67, "value-the" should read --value - the--.

COLUMN 9

Line 8, "indicted" should read --indicated--.

COLUMN 11

Line 54, "was" should be deleted.

COLUMN 12

Line 13, "can" should read --can be--.
    Line 48, "is penetrated" should read --penetrates--.

COLUMN 13

Line 13, "resultants" should read --resultant--.

COLUMN 15

Line 6, "is gradually decayed" should read --gradually decays--.
    Line 16, "is decayed should read --decays--.
    Line 18, "is occurred" should read --occurs--.

UNITED STATES PATENT AND TRADEMARK OFFICE
CERTIFICATE OF CORRECTION

PATENT NO.  : 5,534,070

DATED       : July 9, 1996

INVENTOR(S) : NOBUYUKI OKAMURA ET AL.

It is certified that error appears in the above-identified patent and that said Letters Patent is hereby corrected as shown below:

COLUMN 18

Line 25, "was" should be deleted.

COLUMN 19

Line 66, "was" should be deleted.

COLUMN 20

Line 49, "was" should be deleted.
　　Line 56, "thee" should read --the--.

COLUMN 22

Line 5, "entail" should read --entails--.
　　Line 15, "produce" should read --produced--.

COLUMN 23

Line 22, "45permalloy," should read --45 Permalloy,--.

COLUMN 24

Line 27, "more" should read --more of--.

COLUMN 25

Line 42, "retenditivty" should read --retentivity--.

UNITED STATES PATENT AND TRADEMARK OFFICE
CERTIFICATE OF CORRECTION

PATENT NO. : 5,534,070

DATED : July 9, 1996

INVENTOR(S) : NOBUYUKI OKAMURA ET AL.    Page 4 of 4

It is certified that error appears in the above-identified patent and that said Letters Patent is hereby corrected as shown below:

COLUMN 32

```
Line 57, "range" should read --range is-- and "frequency"
    should read --frequency energy--.
```

Signed and Sealed this

Seventh Day of January, 1997

Attest:

BRUCE LEHMAN

*Attesting Officer*    *Commissioner of Patents and Trademarks*